(12) United States Patent
Katsumata et al.

(10) Patent No.: US 11,143,691 B2
(45) Date of Patent: Oct. 12, 2021

(54) EVALUATION METHOD, ESTIMATION METHOD, EVALUATION APPARATUS, AND COMBINED EVALUATION APPARATUS

(71) Applicant: FUJI ELECTRIC CO., LTD., Kanagawa (JP)

(72) Inventors: Hiroki Katsumata, Hino (JP); Michio Tamate, Hachioji (JP); Miwako Fujita, Tachikawa (JP); Tamiko Asano, Hino (JP); Yuhei Suzuki, Suzuka (JP); Takashi Kaimi, Neyagawa (JP); Yuta Sunasaka, Fukuoka (JP); Tadanori Yamada, Matsumoto (JP); Ryu Araki, Matsumoto (JP); Bao Cong Hiu, Kokubunji (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 250 days.

(21) Appl. No.: 16/260,130

(22) Filed: Jan. 29, 2019

(65) Prior Publication Data

US 2019/0170807 A1 Jun. 6, 2019

Related U.S. Application Data

(63) Continuation of application No. PCT/JP2018/004486, filed on Feb. 8, 2018.

(30) Foreign Application Priority Data

Feb. 24, 2017 (JP) .............................. JP2017-034168

(51) Int. Cl.
*G01R 31/26* (2020.01)
*G01R 31/00* (2006.01)
*G01R 29/08* (2006.01)

(52) U.S. Cl.
CPC ......... *G01R 31/2626* (2013.01); *G01R 29/08* (2013.01); *G01R 31/002* (2013.01); *G01R 31/26* (2013.01)

(58) Field of Classification Search
CPC ............... G01R 31/2626; G01R 31/26; G01R 31/2608; G01R 31/2621; G01R 29/00;
(Continued)

(56) References Cited

U.S. PATENT DOCUMENTS 4,147,934 A * 4/1979 Tomimasu ................ G01T 1/24
250/370.07
2015/0380338 A1 12/2015 Hori

FOREIGN PATENT DOCUMENTS

EP 2579172 A1 4/2013
JP H06309420 A 11/1994
(Continued)

OTHER PUBLICATIONS

International Search Report for International Patent Application No. PCT/JP2018/004486, issued by the Japan Patent Office dated Mar. 13, 2018.

*Primary Examiner* — Son T Le

(57) ABSTRACT

The radiated noise of a semiconductor device is conveniently evaluated, and the radiated noise of an apparatus equipped with the semiconductor device is estimated. An evaluation method and an evaluation apparatus are provided, including: causing a semiconductor device to perform a switching operation; measuring voltage variation occurring between main terminals of the semiconductor device during the switching operation; and outputting an evaluation benchmark for radiated noise of the semiconductor device based on the voltage variation. The outputting the evaluation
(Continued)

benchmark may include calculating the voltage variation in the semiconductor device for each frequency component as the evaluation benchmark.

19 Claims, 19 Drawing Sheets

(58) Field of Classification Search
CPC .... G01R 29/08; G01R 29/0814; G01R 31/00; G01R 31/001; G01R 31/002; G01R 31/003; G01R 29/26; G01R 19/00; G01R 19/0084; G01R 19/14; G01R 19/145; G01R 19/155; H02M 7/217
See application file for complete search history.

(56) References Cited

FOREIGN PATENT DOCUMENTS

| | | | |
|---|---|---|---|
| JP | H10209832 | A | 8/1998 |
| JP | 2000184695 | A | 6/2000 |
| JP | 2005233833 | A | 9/2005 |
| JP | 2007221876 | A | 8/2007 |
| JP | 2009290938 | A | 12/2009 |
| JP | 2011253434 | A | 12/2011 |
| JP | 2014135095 | A | 7/2014 |
| WO | 2014174854 | A1 | 10/2014 |

* cited by examiner

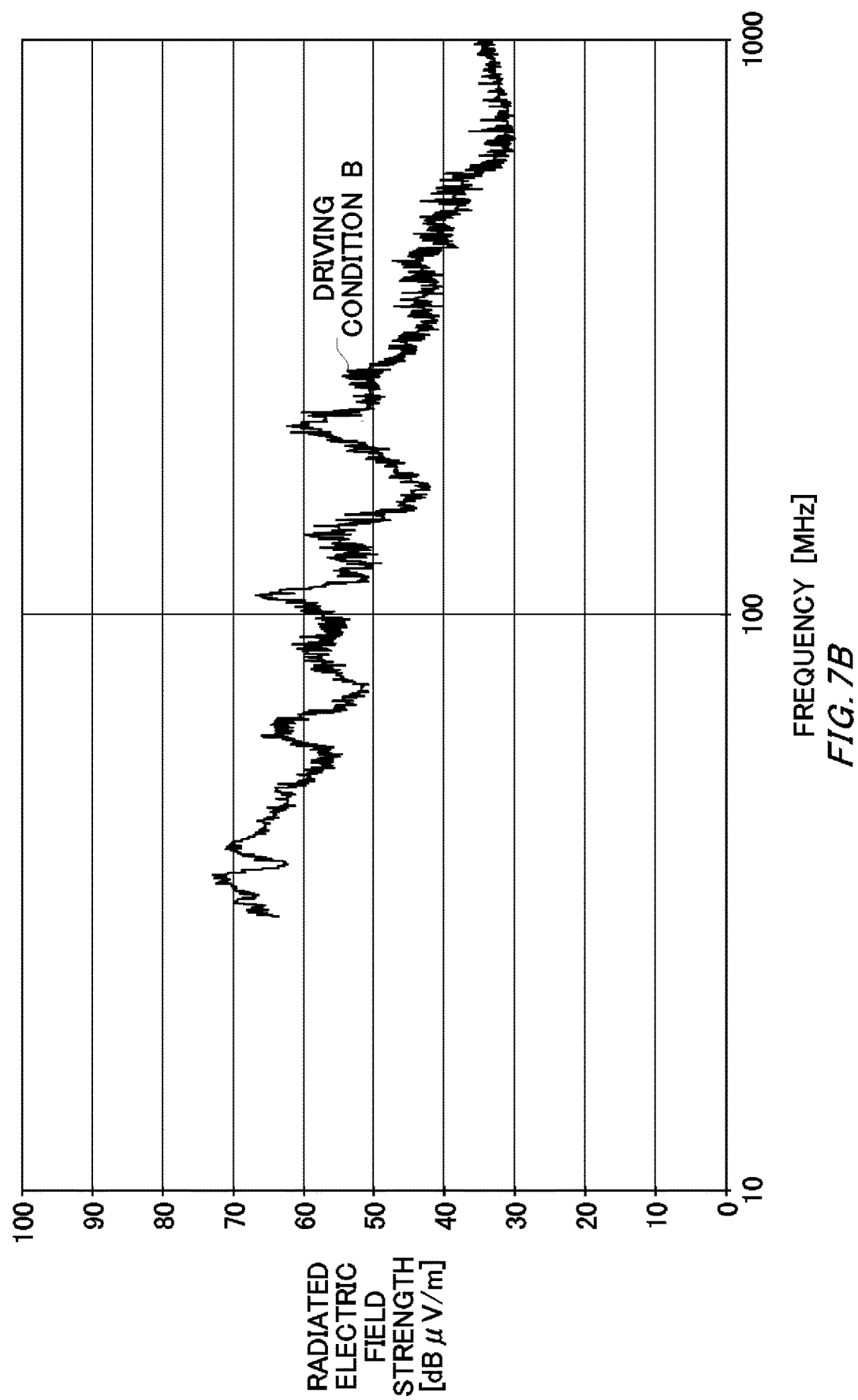

EVALUATION METHOD, ESTIMATION METHOD, EVALUATION APPARATUS, AND COMBINED EVALUATION APPARATUS

The contents of the following Japanese patent application(s) are incorporated herein by reference:
NO. 2017-034168 filed in JP on Feb. 24, 2017, and
NO. PCT/JP2018/004486 filed on Feb. 8, 2018.

BACKGROUND

1. Technical Field

The present invention relates to an evaluation method, an estimation method, an evaluation apparatus, and a combined evaluation apparatus.

2. Related Art

Conventionally, for electromagnetic noise (conducted and radiated types) generated by electrical/electronic equipment including power conversion apparatuses such as inverters and PWM rectifiers, a limit value is set by EMC (Electro-Magnetic Compatibility) standards, and it is required to sufficiently reduce the electromagnetic noise. A method has been proposed for evaluating such electromagnetic noise generated during the operation of a power conversion apparatus by means of simulation or simple measurement (for example, see Patent Documents 1 to 3).

Patent Document 1: Japanese Patent Application Publication No. Hei.
Patent Document 2: Japanese Patent Application Publication No. 2014-135095
Patent Document 3: Japanese Patent Application Publication No. 2005-233833

SUMMARY

Such simulation uses analysis models. However, the analysis models can only be created after determining the details, such as a circuit board and housing structure, of the power conversion apparatus. In addition, the electromagnetic noise evaluation by means of simple measurement can only be performed after completing the power conversion apparatus. Therefore, the electromagnetic noise may be evaluated as "not conforming to the standards" after completing the power conversion apparatus, in which case EMC filter design, parts selection, circuit board artwork, structure consideration and the like needs to be conducted again.

(Item 1)
An evaluation method may include causing a semiconductor device to perform a switching operation.
The evaluation method may include measuring voltage variation occurring between main terminals of the semiconductor device during the switching operation.
The evaluation method may include outputting an evaluation benchmark for radiated noise of the semiconductor device based on the voltage variation.

(Item 2)
The outputting the evaluation benchmark may include calculating the voltage variation in the semiconductor device for each frequency component as the evaluation benchmark.

(Item 3)
The switching operation may include at least two of a turn-on operation, a turn-off operation, a reverse recovery operation, and a forward recovery operation of the semiconductor device.

(Item 4)
The semiconductor device may include a first device and a second device connected in series.
The measuring may include measuring variation in a voltage between the first device and the second device.

(Item 5)
The semiconductor device may include a first device and a second device connected in series.
The measuring may include measuring variation in a voltage across the first device and the second device.

(Item 6)
The measuring may include measuring variation in a voltage of the semiconductor device relative to a reference potential, the reference potential being a potential of a conductive member to which the semiconductor device is attached via an insulating material.

(Item 7)
The evaluation method may include comparing the evaluation benchmark output for the semiconductor device and an evaluation benchmark output for a reference device different from the semiconductor device.
The evaluation method may include evaluating an intensity of the radiated noise of the semiconductor device relative to the reference device based on a result of the comparison.

(Item 8)
An estimation method may estimate radiated noise of an apparatus provided with the semiconductor device.
The estimation method may include acquiring a plurality of evaluation benchmarks for the semiconductor device that are output in correspondence with the switching operation under a plurality of conditions by using the evaluation method according to any one of items 1 to 7.
The estimation method may include combining the plurality of evaluation benchmarks to estimate the radiated noise of the apparatus.

(Item 9)
The combination of the evaluation benchmarks may be a maximum value or a sum of the plurality of evaluation benchmarks for the semiconductor device.

(Item 10)
The combination of the evaluation benchmarks may be an average value of the plurality of evaluation benchmarks for the semiconductor device.

(Item 11)
The combination of the evaluation benchmarks may be an average value calculated after multiplying each of the plurality of evaluation benchmarks for the semiconductor device by a weight for a corresponding one of the plurality of conditions.

(Item 12)
An evaluation apparatus may include a signal supplying unit configured to supply a predetermined switching signal to a to-be-evaluated semiconductor device.
The evaluation apparatus may include a detection unit configured to detect voltage variation in the semiconductor device.
The evaluation apparatus may include an evaluation benchmark output unit configured to output an evaluation benchmark for radiated noise of the semiconductor device based on a result of the detection by the detection unit.

(Item 13)
The evaluation benchmark output unit may be configured to calculate an electric field strength corresponding to the radiated noise of the semiconductor device based on a frequency component of the voltage variation.

(Item 14)

The signal supplying unit may be configured to supply a switching signal to perform at least two of a turn-on operation, a turn-off operation, a reverse recovery operation, and a forward recovery operation of the semiconductor device.

(Item 15)

The semiconductor device may include a first device and a second device connected in series.

The detection unit may be configured to measure variation in a voltage between the first device and the second device.

(Item 16)

The semiconductor device may include a first device and a second device connected in series.

The detection unit may be configured to measure variation in a voltage between main terminals of the first device and the second device.

(Item 17)

The evaluation apparatus may include a storage unit configured to store the evaluation benchmark output by the evaluation benchmark output unit.

The evaluation apparatus may include a comparison unit configured to compare the evaluation benchmark output by the evaluation benchmark output unit and an evaluation benchmark for a reference device different from the semiconductor device stored in the storage unit.

The evaluation apparatus may include an evaluation unit configured to evaluate a relative change in intensity of the evaluation benchmark for the radiated noise of the semiconductor device based on a result of the comparison.

(Item 18)

The detection unit may be configured to measure variation in a voltage of the semiconductor device relative to a reference potential, the reference potential being a potential of a conductive member to which the semiconductor device is attached via an insulating material.

(Item 19)

A combined evaluation apparatus may include an acquisition unit configured to acquire a plurality of evaluation benchmarks for the semiconductor device that are output by the evaluation apparatus according to any one of items 12 to 18 in correspondence with the switching signal under a plurality of conditions.

The combined evaluation apparatus may include a combined evaluation unit configured to combine the plurality of evaluation benchmarks to estimate radiated noise of an apparatus provided with the semiconductor device.

The summary clause does not necessarily describe all necessary features of the embodiments of the present invention. The present invention may also be a sub-combination of the features described above.

BRIEF DESCRIPTION OF THE DRAWINGS

FIG. 7B shows an example of radiated noise measured by the measurement system shown in FIG. 6.

DESCRIPTION OF EXEMPLARY EMBODIMENTS

Hereinafter, (some) embodiment(s) of the present invention will be described. The embodiment(s) do(es) not limit the invention according to the claims, and all the combinations of the features described in the embodiment(s) are not necessarily essential to means provided by aspects of the invention.

Figure 1:
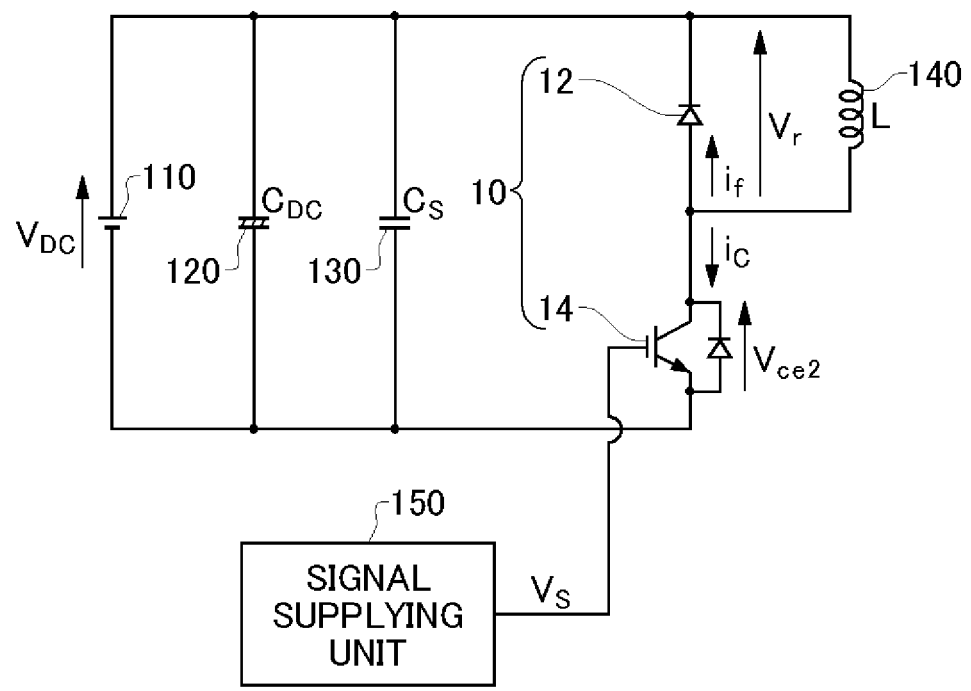
FIG. 1 shows an example configuration of an evaluation circuit 100 for evaluating switching characteristics of a semiconductor device 10.

FIG. 1 shows an example configuration of an evaluation circuit 100 for evaluating switching characteristics of a semiconductor device 10. An example is shown in which the to-be-evaluated semiconductor device 10 includes a first device 12 and a second device 14 connected in series. FIG. 1 shows an example in which the first device 12 is a diode and the second device 14 is a combination of an IGBT and an anti-parallel connected diode. Using the evaluation circuit 100 shown in FIG. 1, switching losses, voltage overshoots and the like of the semiconductor device 10 can be evaluated by performing turn-on operations, turn-off operations and the like of the second device 14. The evaluation circuit 100 includes a power supply 110, a first capacitive unit 120, a second capacitive unit 130, a load reactor 140, and a signal supplying unit 150.

The power supply 110 is a DC power supply which outputs a DC voltage $V_{DC}$. The power supply 110 is connected to both ends of the semiconductor device 10. For example, the power supply 110 is connected to one end (the cathode terminal) of the first device 12 and the other end (the emitter terminal) of the second device 14, and supplies the DC voltage to the first device 12 and the second device 14. In this case, the other end (the anode terminal) of the first device 12 is connected to one end (the collector terminal) of the second device 14.

The first capacitive unit 120 is connected parallel to the semiconductor device 10, and smoothens the DC voltage $V_{DC}$ output from the power supply 110. The first capacitive unit 120 is a capacitor having a capacitance $C_{DC}$, for example. The first capacitive unit 120 is an electrolytic capacitor, as an example. The second capacitive unit 130 is connected parallel to the semiconductor device 10, and reduces voltage overshoots. The second capacitive unit 130 is a capacitor having a capacitance $C_S$, for example. It is desirable that the first capacitive unit 120 and the second capacitive unit 130 are capacitors having different capacitances, for example, the capacitance $C_{DC}$ is larger than the capacitance $C_S$.

The load reactor 140 is connected to both ends the first device 12. The load reactor 140 has an inductance L, as an example.

The signal supplying unit 150 supplies a predetermined switching signal to the semiconductor device 10. For example, the signal supplying unit 150 includes a pulse generator, an amplification circuit and the like, and supplies a pulsed switching signal $V_S$ to the gate terminal of the second device 14. In the second device 14, when the switching signal $V_S$ is supplied to the gate terminal, the electrical connection between the collector terminal and the emitter terminal is switched between a connected state (ON state) and a disconnected state (OFF state).

In the above evaluation circuit 100, the semiconductor device 10 can be caused to perform switching operations by supplying the switching signal to the second device 14. Therefore, switching characteristics of the second device 14 can be acquired by, for example, measuring a collector current $i_c$ flowing in the collector terminal during the switching operations with an external measurement apparatus or the like.

Also, the switching characteristics of the first device 12 can be evaluated by measuring a forward current $i_f$ flowing in the first device 12 during the switching operations with an external measurement apparatus or the like. Note that the voltage between the collector and emitter terminals of the second device 14 is referred to as $V_{ce2}$, and the voltage across the first device 12 is referred to as $V_r$. The measurement of the switching characteristics using the evaluation circuit 100 is described as follows.

Figure 2:
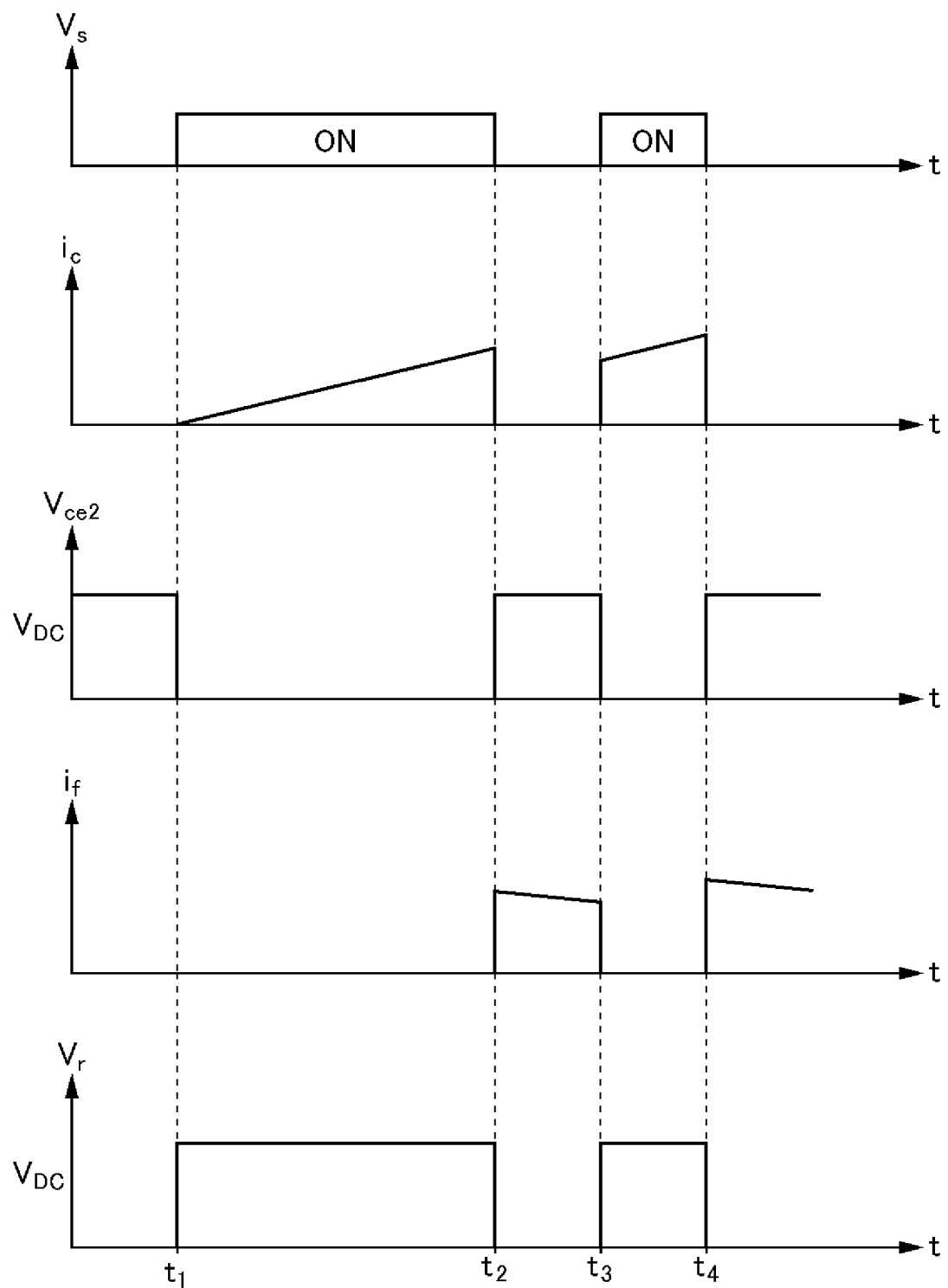
FIG. 2 shows an example of the result of measuring the switching characteristics of the semiconductor device 10 using the evaluation circuit 100.

FIG. 2 shows an example of the result of measuring the switching characteristics of the semiconductor device 10 using the evaluation circuit 100. In FIG. 2, the horizontal axis indicates time and the vertical axis indicates voltage values or current values. FIG. 2 shows an example in which the evaluation circuit 100 switches the second device 14 between the ON state and the OFF state with the switching signal $V_S$ to cause the second device 14 to perform turn-on operations and turn-off operations.

At time $t_1$, the switching signal $V_S$ becomes a high voltage and turns the second device 14 to the ON state. When conduction is made between the collector terminal and the emitter terminal of the second device 14, current flows from the power supply 110 through the load reactor 140 into the second device 14. The current flowing into the second device 14 is observed as a collector current $i_c$, and increases at a substantially constant rate of change di/dt from time $t_1$. The rate of change di/dt is represented by the following equation.

$$di/dt = V_{DC}/L \qquad \text{(Equation 1)}$$

At time $t_2$, the switching signal $V_S$ becomes a low voltage and turns the second device 14 to the OFF state. In the evaluation circuit 100, the time period from time $t_1$ to time $t_2$ may be set such that the second device 14 is switched to the OFF state at the time point when a predetermined amount of the collector current $i_c$ flows. In this manner, in the evaluation circuit 100, the turn-off operation of the second device 14 can be performed under a predetermined condition of the collector current $i_c$. That is, the transient response of the second device 14 for its turn-off operation under a predetermined condition of the collector current $i_c$ can be measured.

The voltage $V_{ce2}$ between the collector and emitter terminals is substantially the same as the DC voltage $V_{DC}$ during the time period until time $t_1$, in which the second device 14 is in the OFF state. During the time period from time $t_1$ to time $t_2$, the second device 14 is in the ON state, and thus the voltage $V_{ce2}$ between the terminals is substantially 0 V. During the time period until time $t_2$, no current flows in the first device 12, and thus the forward current $i_f$ is substantially 0 A. The voltage $V_r$ across the first device 12 is substantially 0 V until time $t_1$, and is substantially the same as the DC voltage $V_{DC}$ during the time period from time $t_1$ to time $t_2$.

When the second device 14 is turned to the OFF state at time $t_2$, the load reactor 140 acts to continuously pass the current that has been flowing therein, and therefore the current refluxes along a path from the load reactor 140 to the first device 12. Therefore, the forward current $i_f$ of the first device 12 rises at time $t_2$, and its current value gradually decreases over time. Note that the rising of the forward current $i_f$ of the first device 12 at time $t_2$ is referred to as a forward recovery operation. By turning the second device 14 to the ON state while the forward current $i_f$ flows in the first device 12, a reverse recovery operation of the first device 12 and a turn-on operation of the second device 14 can be performed.

In the evaluation circuit 100, the time period from time $t_2$ to time $t_3$ may be set such that the second device 14 is switched to the ON state at the time point when a predetermined amount of the forward current $i_f$ flows. In this manner, in the evaluation circuit 100, the reverse recovery operation of the first device 12 and the turn-on operation of the second device 14 can be performed under a predetermined condition of the forward current $i_f$. That is, the transient response of the second device 14 and the first device 12 for the turn-on operation of the second device 14 under a predetermined condition of the forward current $i_f$ can be measured.

Thus, at time $t_3$, the switching signal $V_S$ becomes a high voltage again and turns the second device 14 to the ON state. The voltage $V_{ce2}$ between the terminals of the second device 14 is substantially the same voltage as the DC voltage $V_{DC}$ during the time period from time $t_2$ to time $t_3$, in which the second device 14 is in OFF state, and becomes substantially 0 V again from time $t_3$. The voltage $V_r$ across the first device 12 is substantially 0 V during the time period from time $t_2$ to time $t_3$, and becomes substantially the same as the DC voltage $V_{DC}$ again from time $t_3$.

The forward recovery operation of the first device 12 and the turn-off operation of the second device 14 can be observed at least partially in the same time region with the same switching signal $V_S$. Similarly, the reverse recovery operation of the first device 12 and the turn-on operation of the second device 14 can be observed at least partially in the same time region with the same switching signal $V_S$.

For example, a case is considered in which the signal supplying unit 150 supplies the switching signal $V_S$ to the gate terminal of the second device 14 to cause the second device 14 to perform a turn-on operation. In this case, turn-on characteristics of the second device 14 can be observed by detecting the transient response of the voltage $V_{ce2}$ between the collector and emitter terminals of the second device 14. Also, forward recovery characteristics of the first device 12 can be observed by detecting the current $i_f$ flowing in the first device 12.

Similarly, a case is considered in which the signal supplying unit 150 supplies the switching signal $V_S$ to the gate terminal of the second device 14 to cause the second device 14 to perform a turn-off operation. In this case, turn-off characteristics of the second device 14 can be observed by detecting the voltage $V_{ce2}$ between the collector and emitter terminals of the second device 14. Also, reverse recovery characteristics of the first device 12 can be observed by detecting the current $i_f$ flowing in the first device 12.

The switching characteristics of the semiconductor device 10 are thus measured using the evaluation circuit 100 and, for example, if evaluated to be a non-defective product that meets a predetermined criteria, the semiconductor device 10 is shipped to the market or the like. However, even if a power conversion apparatus or the like is manufactured using the semiconductor device 10 with good switching characteristics, electromagnetic noise generated by the power conversion apparatus may exceed a standard value defined by the EMC standards. In this case, EMC filter design, re-selection of parts including the semiconductor device 10, circuit board artwork, structure consideration and the like needs to be conducted again after completing the power conversion apparatus, and enormous trouble and cost would occur.

Thus, in addition to evaluating the switching characteristics of the semiconductor device 10, the evaluation apparatus 200 according to the present embodiment evaluates radiated noise of the semiconductor device 10 and outputs an evaluation benchmark. In this manner, radiated noise generated by a power conversion apparatus or the like equipped with the semiconductor device 10 can be estimated before completing the power conversion apparatus, so that the trouble and cost involved in the manufacturing process are reduced. Such an evaluation apparatus 200 is described as follows.

Figure 3:
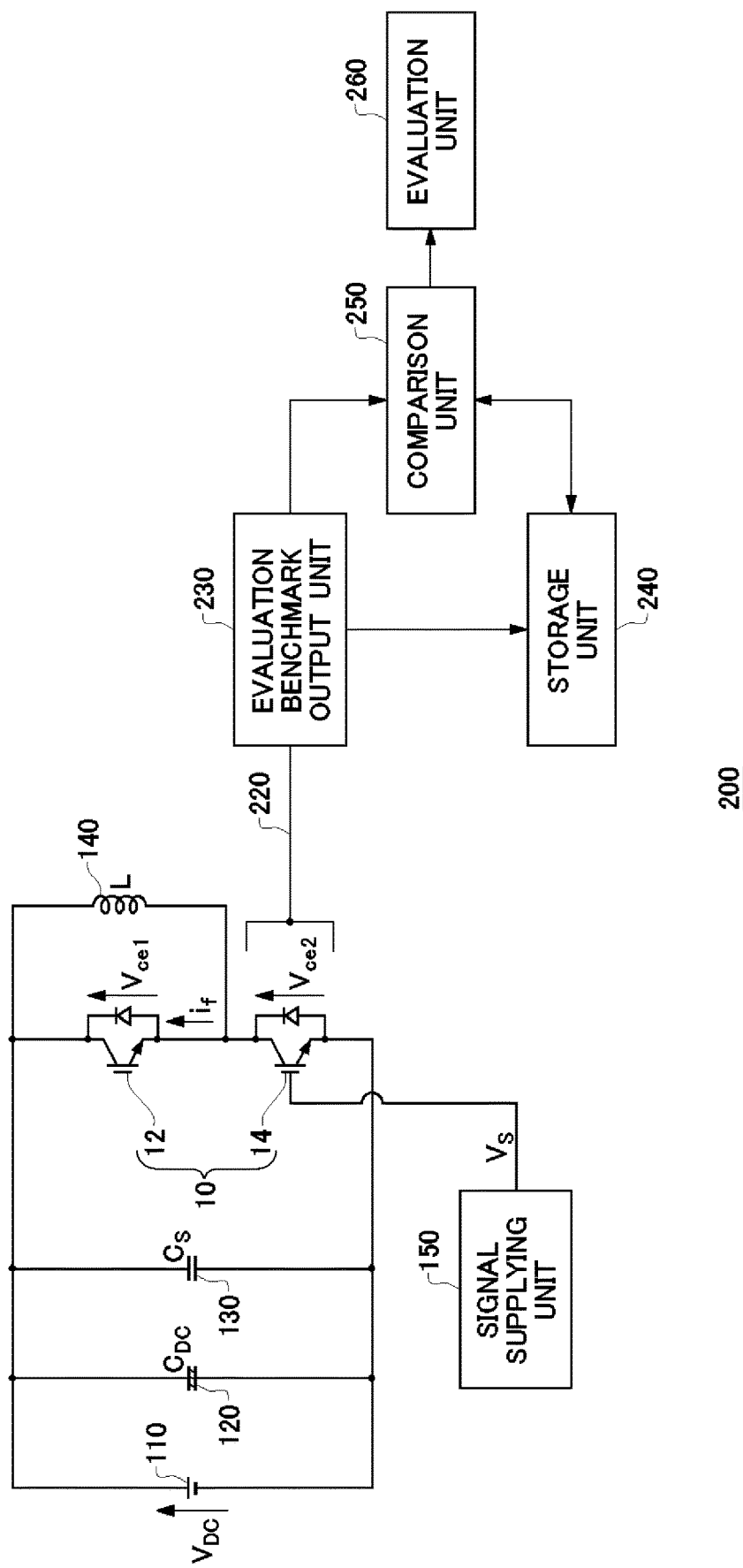
FIG. 3 shows an example configuration of an evaluation apparatus 200 in the present embodiment together with the to-be-evaluated semiconductor device 10.

FIG. 3 shows an example configuration of an evaluation apparatus 200 in the present embodiment together with the to-be-evaluated semiconductor device 10. The configuration of the evaluation apparatus 200 is partially similar to that of the evaluation circuit 100 shown in FIG. 1. Therefore, the evaluation apparatus 200 can be used to evaluate the switching characteristics of the semiconductor device 10 described with reference to FIG. 1 and FIG. 2. The evaluation apparatus 200 includes a power supply 110, a first capacitive unit 120, a second capacitive unit 130, a load reactor 140, a signal supplying unit 150, a detection unit 220, an evaluation benchmark output unit 230, a storage unit 240, a comparison unit 250, and an evaluation unit 260.

The power supply 110, the first capacitive unit 120, the second capacitive unit 130, the load reactor 140, and the signal supplying unit 150 shown in FIG. 3 operate in substantially the same manner as the power supply 110, the first capacitive unit 120, the second capacitive unit 130, the load reactor 140 and the signal supplying unit 150 described with reference to FIG. 1, and they are given the same references. Therefore, the description thereof will not be repeated here.

FIG. 3 shows an example in which the to-be-evaluated semiconductor device 10 includes a first device 12 and a second device 14 connected in series. The first device 12 and the second device 14 are semiconductor switches such as MOSFET or IGBT, for example. FIG. 3 shows an example in which the first device 12 and the second device 14 are IGBTs to which respective diodes are anti-parallel connected. That is, the load reactor 140 is connected between one and the other ends of the first device 12, where the one end of the first device 12 is the collector terminal and the other end is the emitter terminal.

The detection unit 220 detects voltage variation in the semiconductor device 10. For example, the detection unit 220 detects the variation in the voltage of the semiconductor device 10 occurring in association with switching operations. For example, the detection unit 220 observes the variation in the voltage between the first device 12 and the second device 14. Alternatively, the detection unit 220 may detect either one of a voltage $V_{ce1}$ between the collector and emitter terminals, i.e., between one and the other ends of the first device 12, or a voltage $V_{ce2}$ between the collector and emitter terminals, i.e., between one and the other ends of the second device 14. The detection unit 220 has voltage probes, and the voltage probes are electrically connected to one and the other ends of the first device 12 and the second device 14.

The evaluation benchmark output unit 230 outputs an evaluation benchmark for the radiated noise of the semiconductor device 10 based on the detection result of the detection unit 220. The evaluation benchmark output unit 230 outputs frequency components of the voltage variation detected by the detection unit 220 as the evaluation benchmark for the radiated noise. As an example, the evaluation benchmark output unit 230 includes a measurement instrument for performing frequency domain measurement such as a spectrum analyzer, and outputs the result of the frequency domain measurement as the evaluation benchmark. Also, the evaluation benchmark output unit 230 includes an instrument for time domain measurement such as an oscilloscope, and performs the Fourier transform on the result of the time domain measurement to convert it into frequency domain data and outputs it as the evaluation benchmark. The evaluation benchmark output unit 230 supplies the evaluation benchmark to the storage unit 240 and the comparison unit 250.

The storage unit 240 stores the evaluation benchmark output by the evaluation benchmark output unit 230. For example, the storage unit 240 stores the evaluation benchmark by associating it with the to-be-evaluated semiconductor device 10 evaluated by the evaluation apparatus 200. As an example, the storage unit 240 may serve as an evaluation benchmark database storing previous evaluation benchmarks output by the evaluation apparatus 200 after performing evaluations. Note that the storage unit 240 may be provided either internal or external to the evaluation apparatus 200. Also, the storage unit 240 can be a database connected to the body of the evaluation apparatus 200 via a network or the like.

The comparison unit 250 compares the evaluation benchmark output by the evaluation benchmark output unit 230 at the present cycle and a previous evaluation benchmark for a reference device different from the semiconductor device 10 stored in the storage unit 240. If the semiconductor device 10 is an improved version of the reference device, the comparison unit 250 compares an evaluation benchmark for the reference device before the improvement and an evaluation benchmark for the semiconductor device 10 after the improvement.

The evaluation unit 260 evaluates the relative change in intensity of the radiated noise of the semiconductor device 10 based on the comparison result of the comparison unit 250. The evaluation unit 260 outputs an evaluation result. The evaluation unit 260 may output the evaluation result to a display device or the like, and may further output it to an external database or the like. The evaluation unit 260 may output the evaluation result in a predetermined format such as a data sheet.

The above evaluation apparatus 200 according to the present embodiment evaluates the radiated noise of the semiconductor device 10 by causing the semiconductor device 10 described with reference to FIG. 1 and FIG. 2 to perform switching operations. The operations of evaluation on the semiconductor device 10 by the evaluation apparatus 200 are described as follows.

Figure 4:
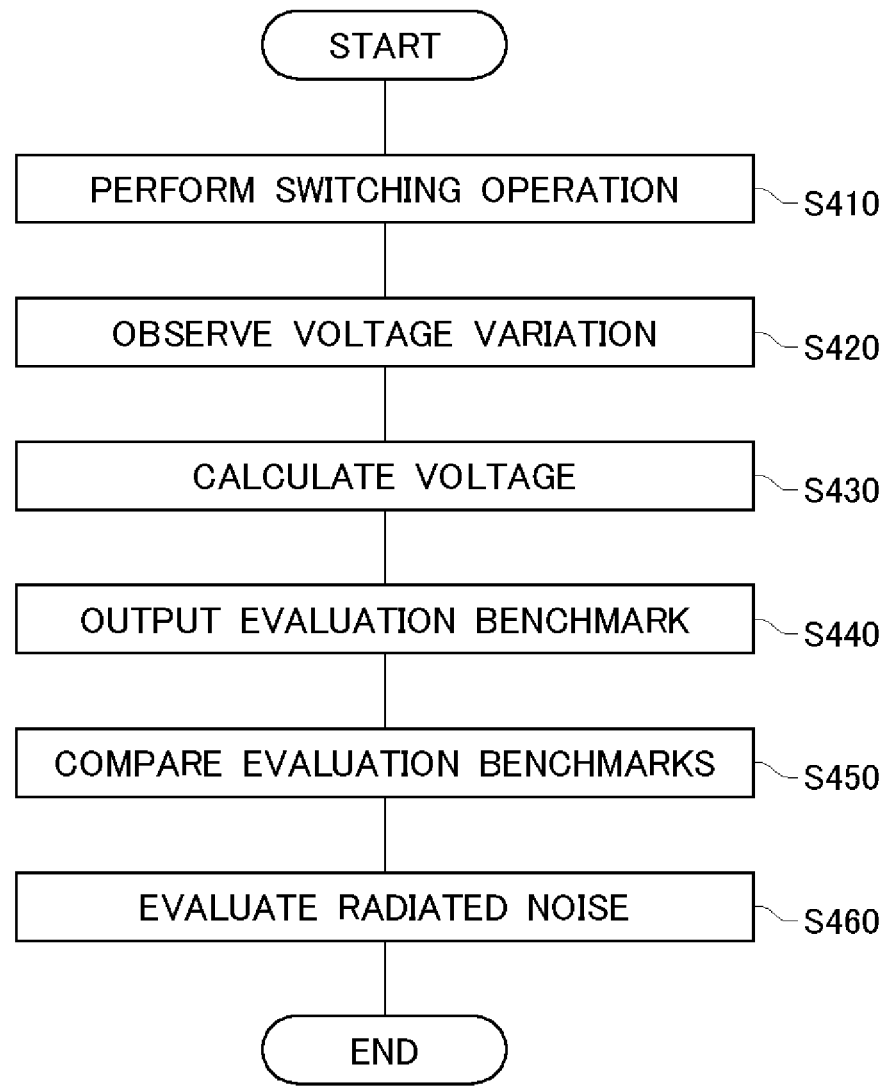
FIG. 4 shows an operation flow of the evaluation apparatus 200 according to the present embodiment.

FIG. 4 shows an operation flow of the evaluation apparatus 200 according to the present embodiment. The evaluation apparatus 200 performs the operations of S410 to S460 shown in FIG. 4 to evaluate the radiated noise of the to-be-evaluated semiconductor device 10.

First, the semiconductor device 10, to which a voltage probe of the detection unit 220 is electrically connected, is caused to perform a switching operation (S410). For example, the signal supplying unit 150 supplies the switching signal $V_S$ shown in FIG. 2 to the gate terminal of the second device 14, to cause switching operations such as a forward recovery operation and a reverse recovery operation of the first device 12 and a turn-on operation and a turn-off operation of the second device 14.

The detection unit 220 observes voltage variation in the semiconductor device 10 during the switching operation of the semiconductor device 10 (S420). The detection unit 220 detects the variation in the voltage between the collector terminal and emitter terminal of the first device 12 and the second device 14, or the variation in the voltage of either one of the first device 12 or the second device 14.

Next, frequency components of the voltage variation are calculated (S430). For example, the evaluation benchmark output unit 230 performs frequency conversion on the voltage variation in the semiconductor device 10 detected by the detection unit 220, that is, on its voltage waveform, to calculate the frequency components. The evaluation benchmark output unit 230 may also include a device for frequency domain measurement such as a spectrum analyzer, to observe the frequency components of the voltage variation.

Next, an evaluation benchmark for the radiated noise is output based on the voltage variation (S440). For example, the evaluation benchmark output unit 230 outputs calculated frequency characteristics of the voltage variation as an evaluation benchmark for the radiated noise. The evaluation benchmark is a calculation result of frequency characteristics in a predetermined frequency band such as from 30 MHz to 1 GHz, as an example. The evaluation benchmark output unit 230 outputs the evaluation benchmark to the storage unit 240 for its storage. The evaluation benchmark output unit 230 also supplies the evaluation benchmark to the comparison unit 250. The evaluation benchmark output unit 230 may output the evaluation benchmark as part of the data sheet for the semiconductor device 10.

Next, the evaluation benchmark output for the semiconductor device 10 and an evaluation benchmark previously output for a reference device different from the semiconductor device 10 are compared (S450). For example, the comparison unit 250 reads out the previous evaluation benchmark from the storage unit 240, and compares the evaluation benchmark output by the evaluation benchmark output unit 230 and the previous evaluation benchmark. The comparison unit 250 calculates the differential spectrum between the evaluation benchmarks in a predetermined frequency band, as an example.

Next, the relative change in intensity of the radiated noise of the semiconductor device 10 is evaluated based on the comparison result (S460). For example, the evaluation unit 260 may use the differential spectrum as the relative change in intensity. The evaluation unit 260 may also use a value in the differential spectrum corresponding to a predetermined frequency as the relative change in intensity. The evaluation unit 260 may also use the average value of values in the differential spectrum corresponding to a plurality of predetermined frequencies as the relative change in intensity.

The evaluation unit 260 outputs the relative change in intensity as an evaluation result. The evaluation unit 260 may output the evaluation result for each type of switching operation of the semiconductor device 10. As an example, if the reference device is a device with which an apparatus or the like has previously been equipped, the relative change in intensity will be a benchmark for the relative change in radiated electric field strength caused due to the equipment of the apparatus or the like with the semiconductor device 10. If the reference device is substantially the same as the semiconductor device 10, the relative change in intensity will be a benchmark for the manufacturing variability or change over time of the devices, difference between structures in which the devices are implemented, or the like.

The evaluation apparatus 200 according to the present embodiment can evaluate the radiated noise of the semiconductor device 10 and output the evaluation result in the above operation flow. Note that, while an example has been described above in which the evaluation apparatus 200 outputs the relative change in intensity, which is the difference from a previous evaluation benchmark, as the evaluation result, this is not so limited. The evaluation apparatus 200 may also output an evaluation benchmark indicating the absolute frequency spectrum calculated by the evaluation benchmark output unit 230. If the evaluation apparatus 200 is an apparatus for outputting the evaluation benchmark, the comparison unit 250 and the evaluation unit 260 may be absent.

Figure 5A:
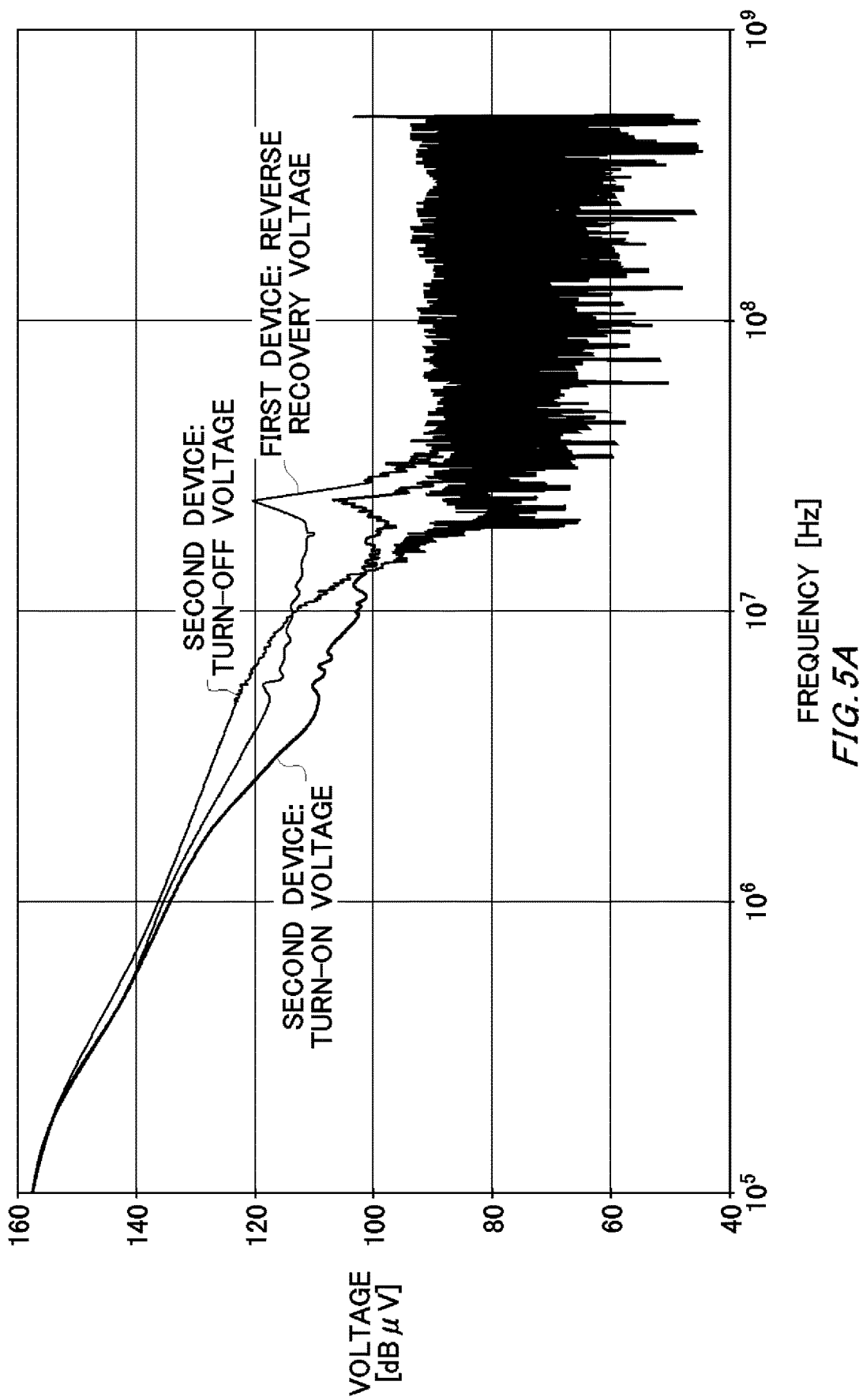
FIG. 5A shows an example of evaluation benchmarks output by an evaluation benchmark output unit 230 according to the present embodiment.
Figure 5B:
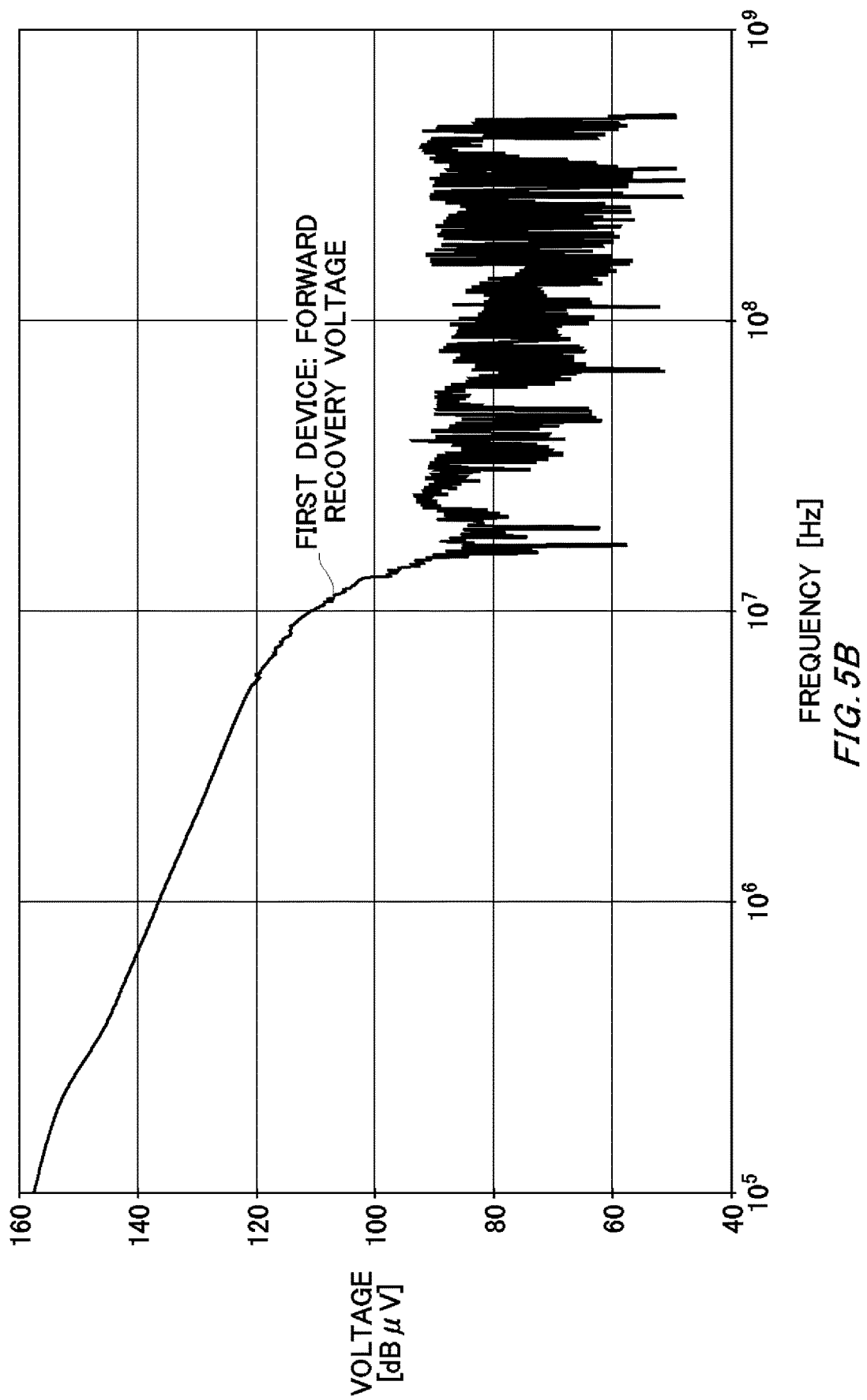
FIG. 5B shows an example of an evaluation benchmark output by the evaluation benchmark output unit 230 according to the present embodiment.

FIG. 5A and FIG. 5B show an example of evaluation benchmarks output by the evaluation benchmark output unit 230 according to the present embodiment. FIG. 5A and FIG. 5B show an example in which the evaluation benchmark output unit 230 outputs evaluation benchmarks for the semiconductor device 10 in a frequency band of 10 MHz to 500 MHz. The evaluation benchmarks output by the evaluation benchmark output unit 230 are the frequency characteristics of "forward recovery voltage" and "reverse recovery voltage" of the first device 12 and "turn-on voltage" and "turn-off voltage" of the second device 14, observed in response to a predetermined switching signal $V_S$.

Measurements have revealed that, for semiconductor devices such as IGBTs, the strength of the radiated electric field generated at the time of turn-on is correlated with the maximum value or sum of the voltages of the turn-on characteristics and reverse recovery characteristics such as shown in FIG. 5A and FIG. 5B. Measurements have also revealed that, for such devices, the strength of the radiated electric field generated at the time of turn-off is correlated with the maximum value or sum of the voltages of the turn-off characteristics and forward recovery characteristics such as shown in FIG. 5A and FIG. 5B.

Therefore, by comparing the maximum value or sum of the voltages of the turn-on characteristics and reverse recovery characteristics and the maximum value or sum of the voltages of the turn-off characteristics and forward recovery characteristics, it is able to know at which of those timings the greater radiated noise is generated. This also allows for taking a measure of such as changing the gate resistance value according to the relative magnitude of radiated noise. Moreover, the voltages of the respective characteristics occurring at the turn-on and turn-off may be balanced. The correlation between the evaluation benchmark and the radiated electric field strength is described as follows.

Figure 6:
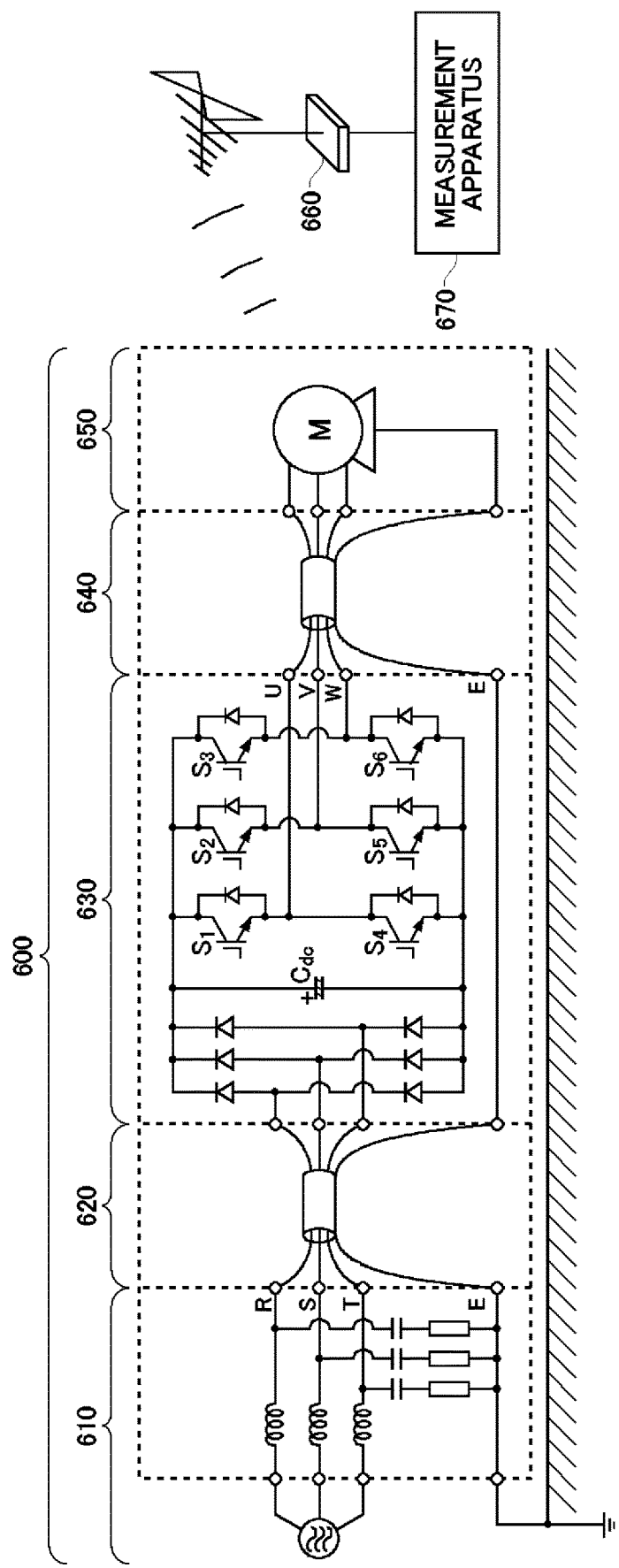
FIG. 6 shows an example configuration for measuring radiated noise of a motor-driving apparatus 600 equipped with the semiconductor device 10 according to the present embodiment.

FIG. 6 shows an example configuration of a measurement system for measuring radiated noise of a motor-driving apparatus 600 equipped with the semiconductor device 10 according to the present embodiment. The motor-driving apparatus 600 is an example apparatus equipped with the semiconductor device 10. The motor-driving apparatus 600 includes a power supply unit 610, an input cable 620, a driving circuit 630, an output cable 640, and a motor 650.

The power supply unit 610 is an AC power supply. The power supply unit 610 may include a line impedance stabilization network (LISN). The input cable 620 transmits the AC voltage output by the power supply unit 610 to the driving circuit 630. The driving circuit 630 generates electrical signals for driving the motor 650. For example, the driving circuit 630 rectifies the AC voltage of the power supply unit 610 with a rectification circuit, and supplies the rectified signal to an inverter circuit, to generate the electrical signals. The output cable 640 transmits the electrical signals output by the driving circuit 630 to the motor 650. The motor 650 rotates according to the electrical signals.

The driving circuit 630 of the motor-driving apparatus 600 as above is equipped with the semiconductor device 10 according to the present embodiment. In FIG. 6, device $S_1$ is the first device 12 and device $S_4$ is the second device 14, for example. Also, device $S_2$ may be the first device 12 and device $S_5$ may be the second device 14. Also, device $S_3$ may be the first device 12 and device $S_6$ may be the second device 14. The semiconductor device 10 may be provided as part of the inverter circuit of the driving circuit 630. Then, the semiconductor device 10 performs switching operations according to electrical signals, and thus generates radiated noise as a result of these operations.

An antenna 660 and a measurement apparatus 670 measure such radiated noise. The antenna 660 receives radiated noise propagated through space. The antenna 660 is disposed at a position spaced at a predetermined distance from the motor-driving apparatus 600. The measurement apparatus 670 receives the signal received by the antenna 660, and converts the received signal into the frequency domain for output. The measurement apparatus 670 may measure a higher frequency region than the rotational frequency of the motor 650. The measurement apparatus 670 may be a spectrum analyzer or the like.

Figure 7A:
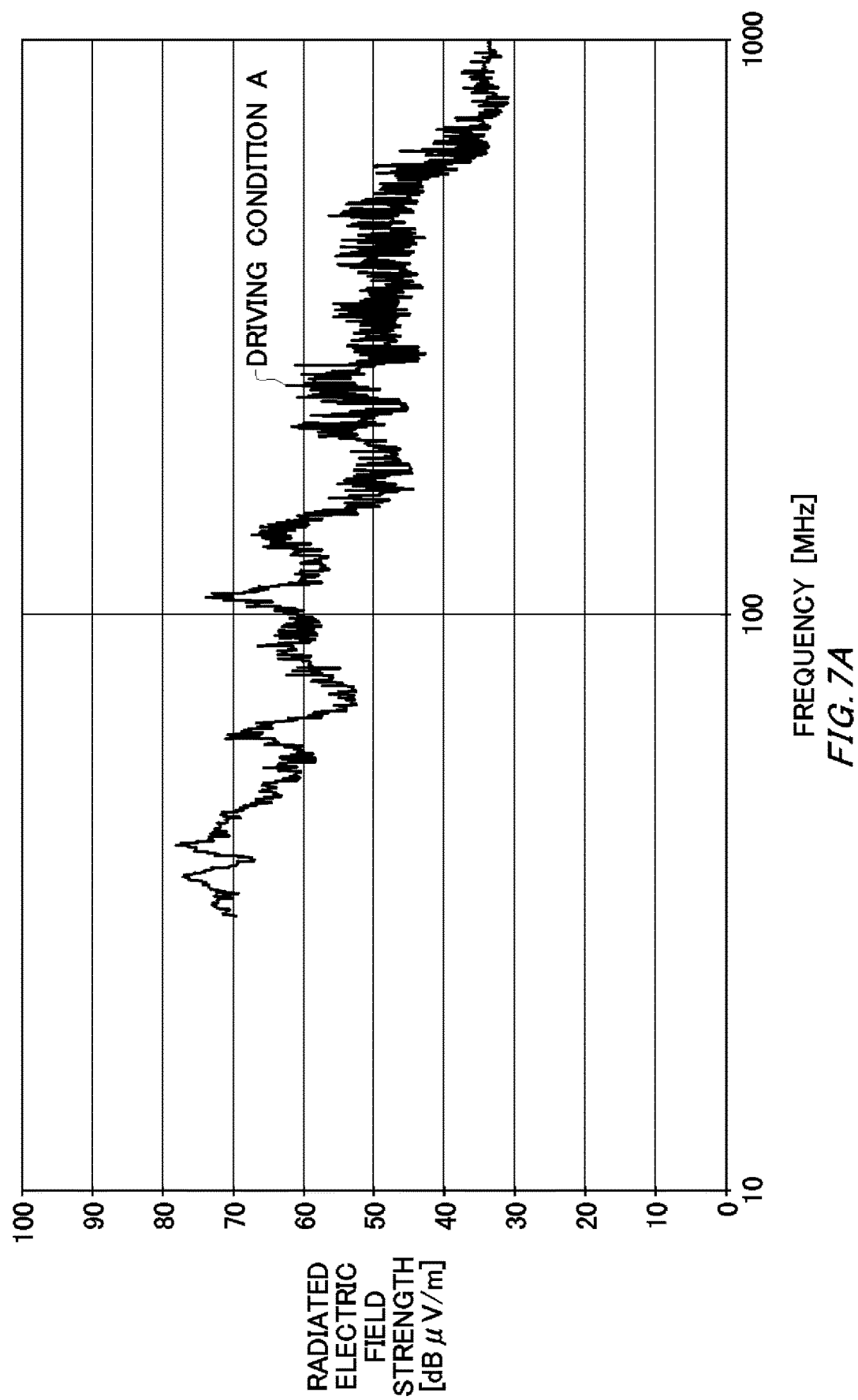
FIG. 7A shows an example of radiated noise measured by the measurement system shown in FIG. 6.

FIG. 7A and FIG. 7B show examples of radiated noise measured by the measurement system shown in FIG. 6. FIG. 7A and FIG. 7B show two examples of radiated noise observed by driving the semiconductor device 10 under different conditions. For example, it can be seen that, if the driving condition of the semiconductor device 10 is changed from condition A to condition B, the radiated electric field strength in a frequency region from 30 MHz to 100 MHz is reduced by about 2 dB to 6 dB.

Figure 8:
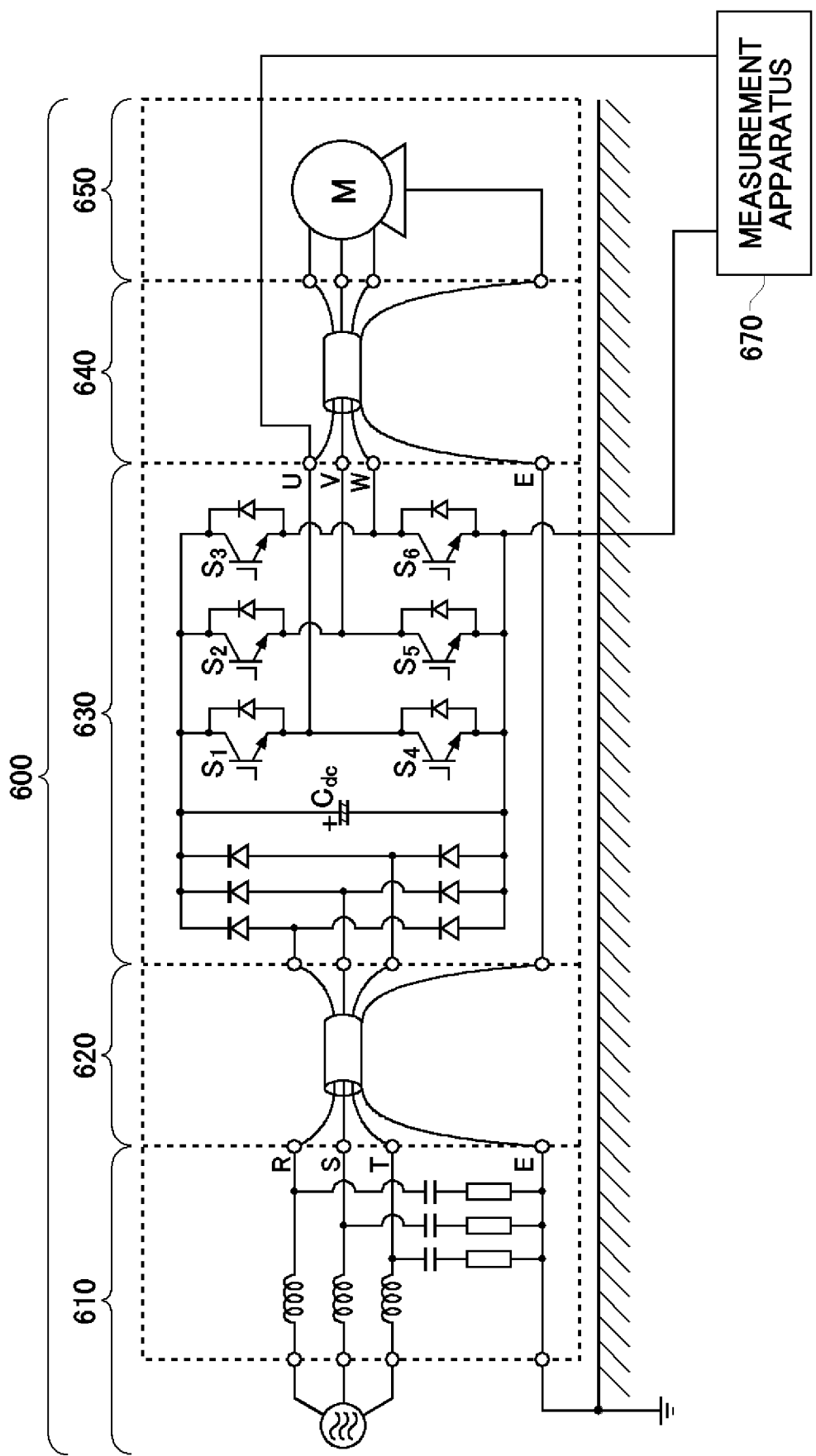
FIG. 8 shows an example configuration of a measurement system for measuring motor-driving electrical signals of the motor-driving apparatus 600 equipped with the semiconductor device 10 according to the present embodiment.

FIG. 8 shows an example configuration of a measurement system for measuring motor-driving electrical signals of the motor-driving apparatus 600 equipped with the semiconductor device 10 according to the present embodiment. In the measurement system shown in FIG. 8, the elements that operate in substantially the same manner as those in the measurement system shown in FIG. 6 are given the same references, and the description thereof will not be repeated. The motor-driving apparatus 600 is substantially the same as the apparatus equipped with the semiconductor device 10 shown in FIG. 6.

In FIG. 8, the measurement apparatus 670 measures electrical signals for driving the motor 650 output by the driving circuit 630. The measurement apparatus 670 measures the switching voltage waveform of the semiconductor device 10 while the motor 650 is driven by the motor-driving apparatus 600.

Figure 9A:
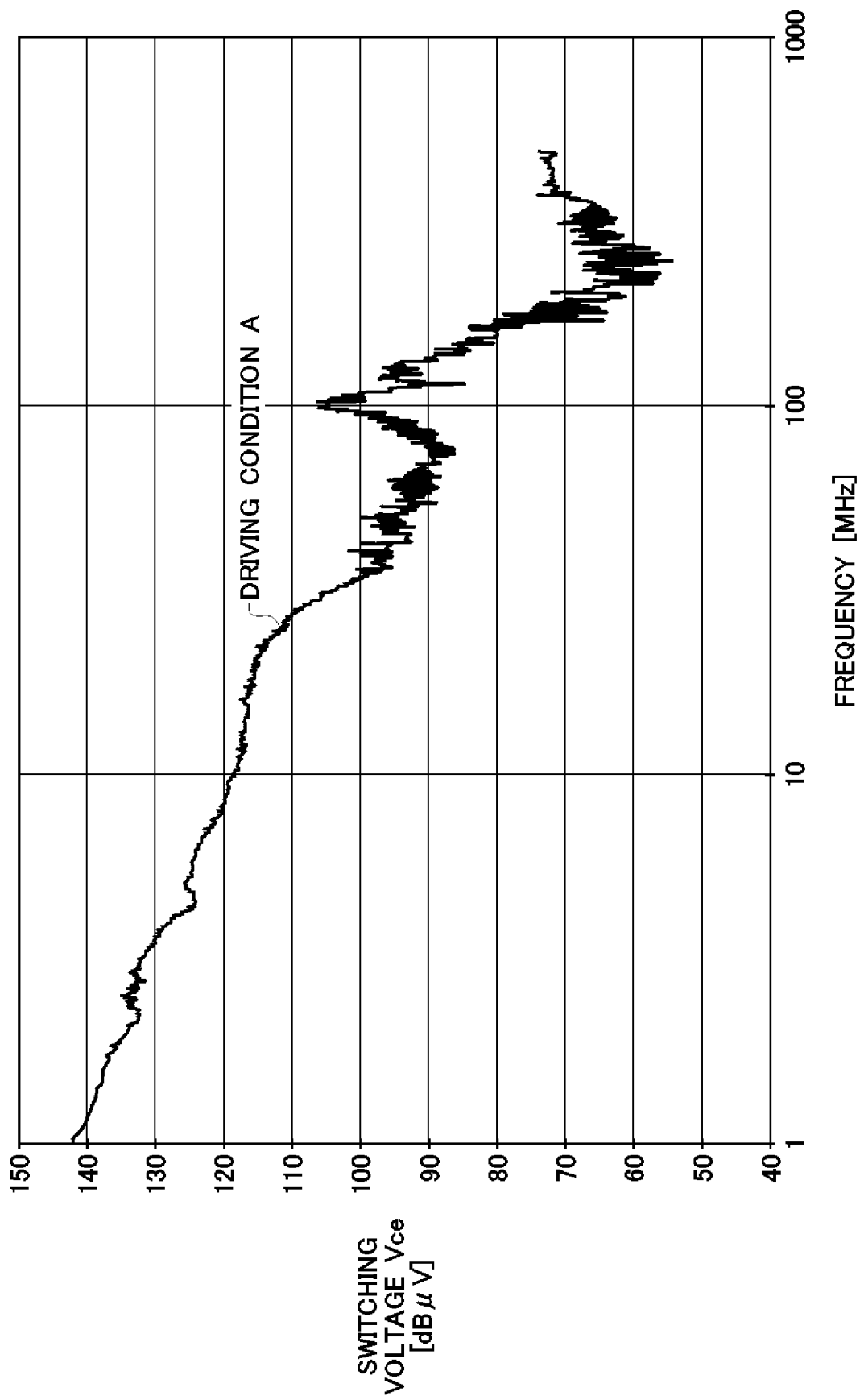
FIG. 9A shows an example of a voltage waveform measured by the measurement system shown in FIG. 8.
Figure 9B:
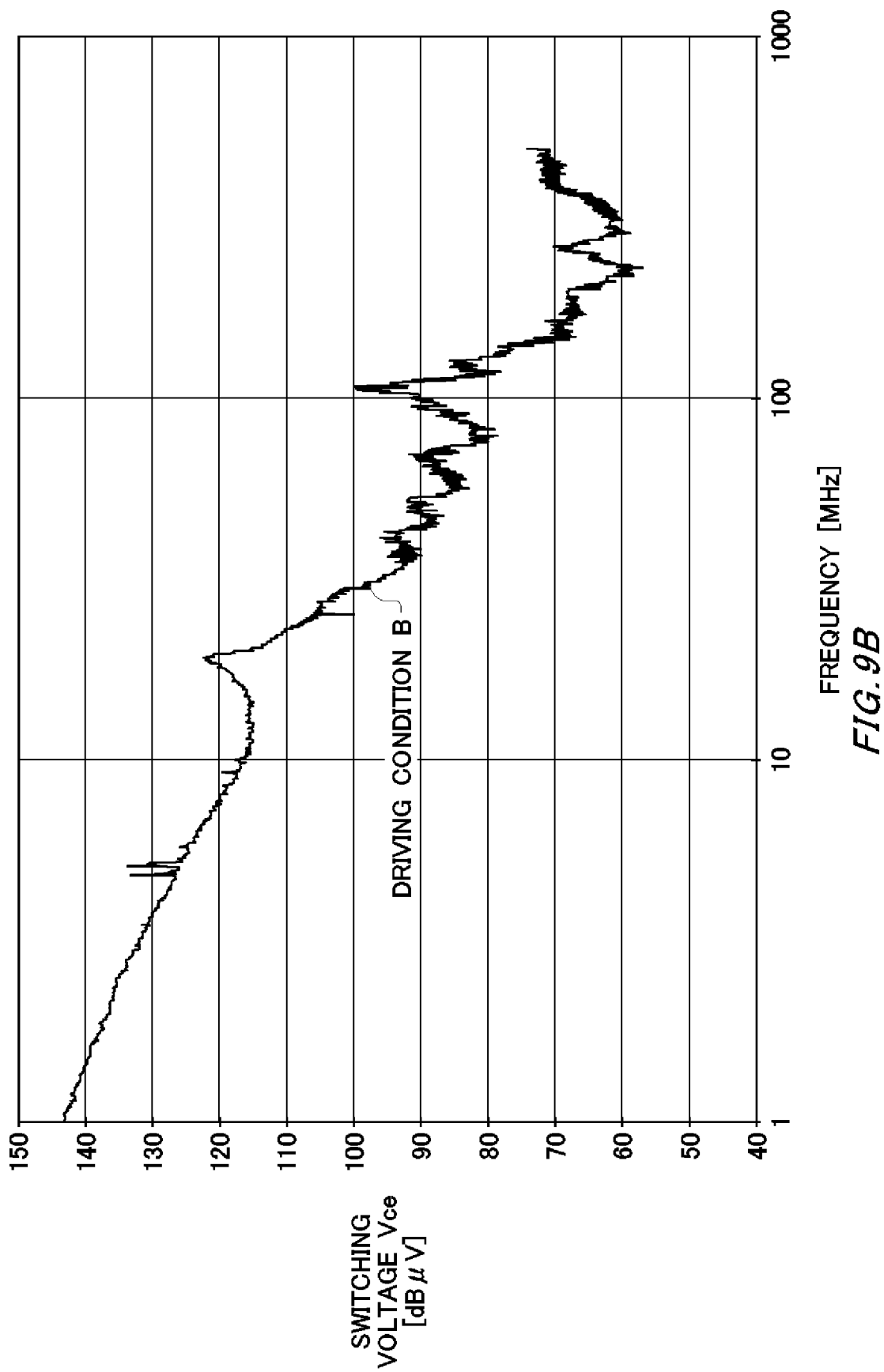
FIG. 9B shows an example of a voltage waveform measured by the measurement system shown in FIG. 8.

FIG. 9A and FIG. 9B show examples of voltage waveforms measured by the measurement system shown in FIG. 8. FIG. 9A and FIG. 9B show the results of frequency analysis on the voltage waveforms in FIG. 7A and FIG. 7B obtained by measuring the radiated noise. For example, it can be seen that, if the driving condition of the semiconductor device 10 is changed from condition A to condition B, the radiated electric field strength in a frequency region from 30 MHz to 100 MHz tends to be reduced by about 2 dB to 6 dB.

Thus, comparing the measurement results from FIG. 6 and FIG. 8, it can be ascertained that the relative change values in changing the driving condition between condition A and condition B show similar tendencies, for example in a frequency region of 30 MHz to 500 MHz. That is, it can be seen that the frequency components into which the switching waveform of the semiconductor device 10 is converted and the radiated noise are correlated, and thus relative values of the radiated noise can be known based on the switching waveform of the semiconductor device 10. Also, it can be seen that, by measuring this correlation in advance, the radiated electric field strength of the radiated noise can be known based on the switching waveform of the semiconductor device 10.

Also, comparing the measurement result from FIG. 8 and the evaluation benchmarks shown in FIG. 5A and FIG. 5B, it can be seen that their characteristics show similar tendencies. That is, it is seen that the evaluation benchmarks output by the evaluation apparatus 200 by evaluating the semiconductor device 10 is correlated with the radiated electric field strength of the radiated noise generated by an apparatus equipped with the semiconductor device 10. Therefore, the amount of generated noise for each type of switching characteristics can be evaluated by analyzing the voltages at particular frequencies in the evaluation benchmarks.

As described above, the evaluation apparatus 200 according to the present embodiment evaluates the radiated noise based on the frequency characteristics of the switching voltage waveforms obtained by causing the semiconductor device 10 to perform the turn-on operation, turn-off operation, reverse recovery operation, and forward recovery operation. The frequency characteristics of the switching voltage waveforms obtained in correspondence with the turn-on operation, turn-off operation, reverse recovery operation, and forward recovery operation are referred to as turn-on characteristics, turn-off characteristics, reverse recovery characteristics, and forward recovery characteristics, respectively.

As shown in FIG. 5A and FIG. 5B, the obtained results of the frequency characteristics of the switching voltage waveforms of the evaluation apparatus 200 are different in voltage depending on the type of switching operation. In particular, the reverse recovery characteristics may have higher voltage than the others at frequencies of 30 MHz or more, which is subject to the regulations of radiated noise. Thus, it is desirable for the evaluation apparatus 200 to perform switching operations including at least the reverse recovery operation of the semiconductor device 10 to output the evaluation benchmarks.

Moreover, if at least two of the four types of characteristics are known, the other types of characteristics may be estimated by analogy. Therefore, it is desirable for the evaluation apparatus 200 to perform switching operations including at least two of the turn-on operation, turn-off operation, reverse recovery operation, and forward recovery operation of the semiconductor device to output the evaluation benchmarks. Note that, in this case, it is further desirable that one of the at least two operations is the reverse recovery operation.

In addition, among the four types of characteristics, the turn-on characteristics may have the next highest voltage after the reverse recovery characteristics than the others. Thus, it is more desirable for the evaluation apparatus 200 to perform switching operations including at least the reverse recovery operation and turn-on operation of the semiconductor device 10 to output the evaluation benchmarks. As described above, the signal supplying unit 150 may supply a switching signal to perform one or at least two of the turn-on operation, turn-off operation, reverse recovery operation, and forward recovery operation of the semiconductor device 10. In this manner, for the evaluation apparatus 200, the time for evaluation can be shortened, and the trouble for evaluation or the like can be reduced.

An example has been described above in which the evaluation apparatus 200 according to the present embodiment observes the variation in the voltage between the first device 12 and the second device 14 connected in series. Additionally or alternatively, the evaluation apparatus 200 may observe the variation in the voltage across the first device 12 and the second device 14. That is, the detection unit 220 is electrically connected to one end of the first device 12 and the other end of the second device 14, and detects the variation in the voltage across the first device 12 and the second device 14.

The voltage across the first device 12 and the second device 14 has a waveform in which a high-frequency fluctuation component $\Delta V_{DC}$ due to switching operations is superimposed on the DC voltage $V_{DC}$ supplied by the power supply 110. The evaluation apparatus 200 may evaluate the radiated noise of the semiconductor device 10 by observing the high-frequency fluctuation component $\Delta V_{DC}$.

When the high-frequency fluctuation component $\Delta V_{DC}$ is observed by causing the semiconductor device 10 to perform the turn-on operation, a voltage variation is observed in which the reverse recovery characteristics of the first device 12 and the turn-on characteristics of the second device 14 are superimposed. That is, in this case, the high-frequency fluctuation component $\Delta V_{DC}$ is correlated with the characteristics having higher voltage among the reverse recovery characteristics of the first device 12 and the turn-on characteristics of the second device 14.

Similarly, when the high-frequency fluctuation component $\Delta V_{DC}$ is observed by causing the semiconductor device 10 to perform the turn-off operation, a voltage variation is observed in which the forward recovery characteristics of the first device 12 and the turn-off characteristics of the second device 14 are superimposed. That is, in this case, the high-frequency fluctuation component $\Delta V_{DC}$ is correlated with the characteristics having higher voltage among the forward recovery characteristics of the first device 12 and the turn-off characteristics of the second device 14.

Therefore, the evaluation apparatus 200 can observe the two switching characteristics having higher voltage among the four switching characteristics by, for example, causing the semiconductor device 10 to perform the turn-on operation and the turn-off operation and observing the high-frequency fluctuation component $\Delta V_{DC}$ one time for each operation. Also, the measurement of the high-frequency fluctuation component $\Delta V_{DC}$ is the observation of frequency characteristics excluding the DC component, and therefore the $\Delta V_{DC}$ component can be easily extracted by performing measurement using AC coupling or inserting a high-pass filter between the detection unit 220 and the evaluation benchmark output unit 230. Therefore, the evaluation apparatus 200 can measure the high-frequency fluctuation component $\Delta V_{DC}$ with an increased S/N ratio and dynamic range.

As described above, the evaluation apparatus 200 according to the present embodiment observes voltage variation in the semiconductor device 10 during switching operations. Here, current flowing in a stray capacitance of the semiconductor device 10 may act as a source of radiated noise. For example, if cooling fins are attached to the semiconductor device 10, a stray capacitance may be formed between a conductive member as part of the cooling fins and the semiconductor device 10, and current flowing in the stray capacitance generates radiated noise.

In such a case, the evaluation apparatus 200 can perform relative evaluation of radiated noise more accurately by acquiring an observation result in consideration of the noise generated due to the stray capacitance. Such an evaluation apparatus 200 is described as follows.

Figure 10:
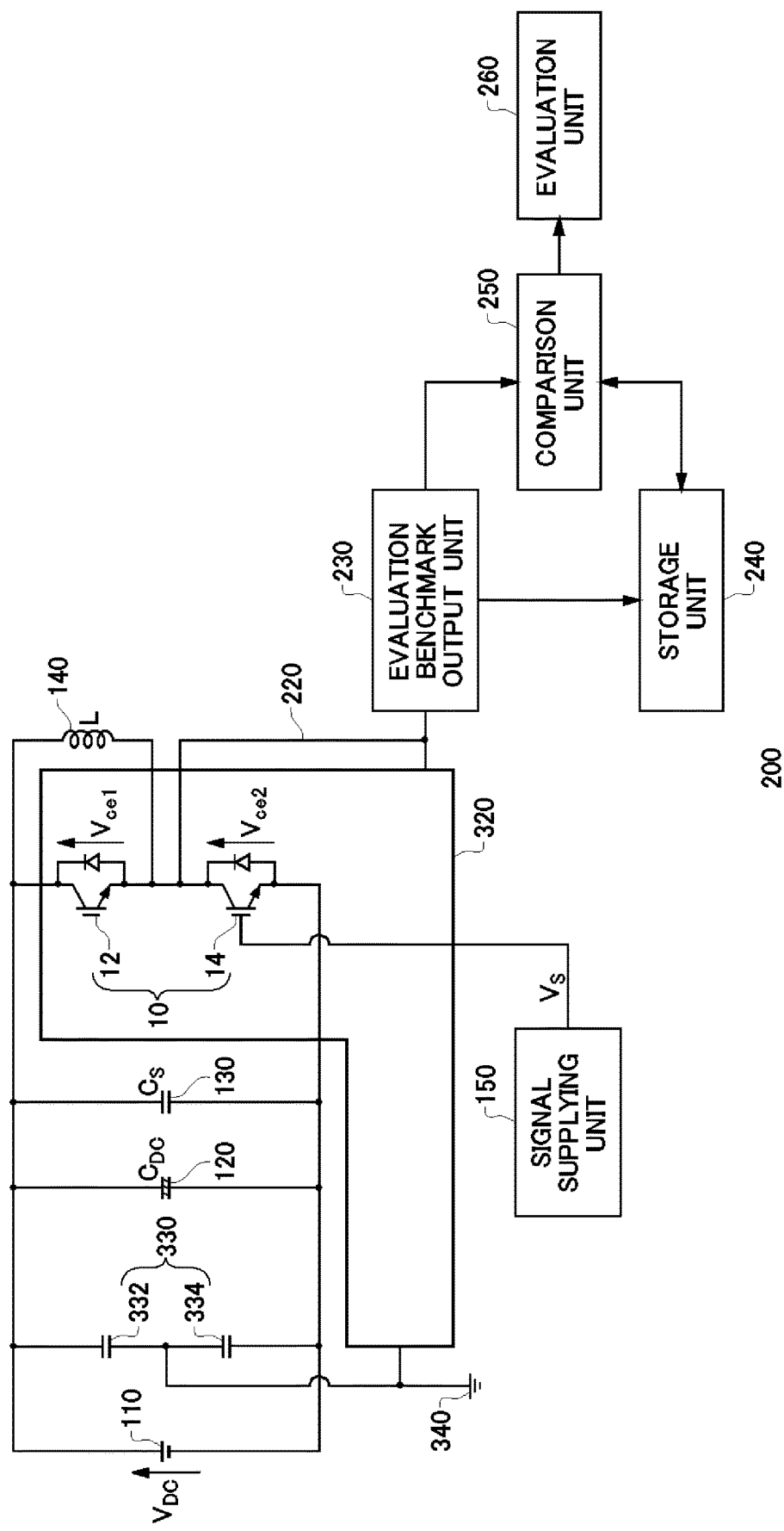
FIG. 10 shows a modified example of the evaluation apparatus 200 according to the present embodiment.

FIG. 10 shows a modified example of the evaluation apparatus 200 according to the present embodiment. The elements of the evaluation apparatus 200 in this modified example that operate in substantially the same manner as those of the evaluation apparatus 200 according to the present embodiment shown in FIG. 3 are given the same references, and the description thereof will not be repeated. The evaluation apparatus 200 of this modified example further includes a conductive member 320 and a third capacitive unit 330.

The conductive member 320 is part of a temperature adjustment unit for adjusting the temperature of the semiconductor device 10. For example, the conductive member 320 is part of at least one of a heater, a cooling device, and heat dissipation fins.

Also, the conductive member 320 has a function of stably maintaining the ambient temperature of the semiconductor device 10. Therefore, it is desirable for the conductive member 320 to be directly fixed to the semiconductor device 10. In this manner, the stray capacitance and the contact resistance between the semiconductor device 10 and the conductive member 320 can be maintained at a substantially constant, stable value.

The evaluation apparatus 200 observes the variation in the voltage of the semiconductor device 10 relative to a reference potential that is the potential of the conductive member 320 fixed to a substrate on which the semiconductor device 10 is disposed. For example, one of the voltage probes of the detection unit 220 is electrically connected to the conductive member 320 and the other is electrically connected between the first device 12 and the second device 14, to detect the variation in the voltage $V_{ce2}$ between the collector and emitter terminals of the second device 14. Alternatively, one of the voltage probes of detection unit 220 may be electrically connected to the conductive member 320 and the other may be electrically connected to one end of the first device 12 closer to the collector terminal, to detect the variation in the voltage across the first device 12 and the second device 14.

As described above, the evaluation apparatus 200 of this modified example stabilizes the stray capacitance between the semiconductor device 10 and the conductive member 320. Since the conductive member 320 is used for temperature stabilization, it is desirable for its surface area to be larger, and its stray capacitance can be larger than other paths. Also, the stray capacitance forms a path for common-mode current, which causes radiated noise. Therefore, the evaluation apparatus 200 can stabilize the noise generated due to the stray capacitance and the common-mode current, to output an evaluation benchmark with higher reproductivity.

Also, the evaluation apparatus 200 of this modified example includes a plurality of capacitive units, each of which is connected parallel to the semiconductor device, and at least one of the plurality of capacitive units may include a plurality of capacitive elements connected in series. FIG. 10 shows an example of the evaluation apparatus 200 in which the third capacitive unit 330 includes a first capacitive element 332 and a second capacitive element 334. A point between the first capacitive element 332 and the second capacitive element 334 is connected to a reference potential 340.

The third capacitive unit 330 is a known circuit used as an EMC filter for reducing radiated noise. Providing such a circuit allows the evaluation apparatus 200 to have a circuit configuration closer to that to be actually equipped with the semiconductor device 10, and to output an evaluation result with higher accuracy. In addition to the third capacitive unit 330, the evaluation apparatus 200 may be further provided with an EMC filter of the same type and/or a different type, or the like.

As described above, the evaluation apparatus 200 according to the present embodiment can evaluate the radiated noise of the semiconductor device 10 by causing the semiconductor device 10 to perform switching operations. However, when an apparatus or the like is actually equipped with the semiconductor device 10, the switching current of the semiconductor device 10 may vary momentarily. The amount of radiated noise varies with the switching current, and thus may have a different result than the evaluation benchmark output by the evaluation apparatus 200.

Figure 11A:
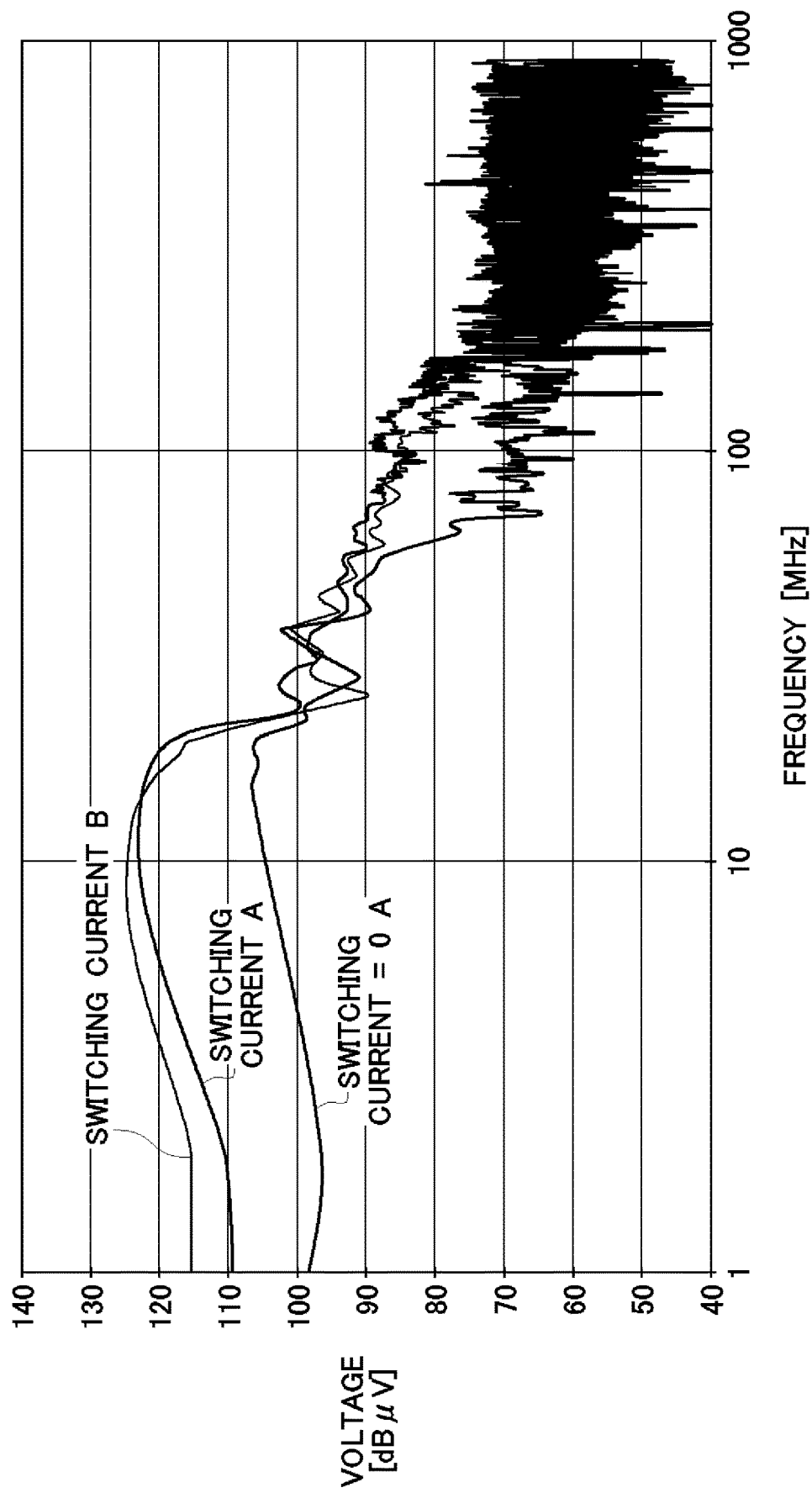
FIG. 11A shows an example of turn-on characteristics of the semiconductor device 10 output as an evaluation benchmark by the evaluation benchmark output unit 230 according to the present embodiment.
Figure 11B:
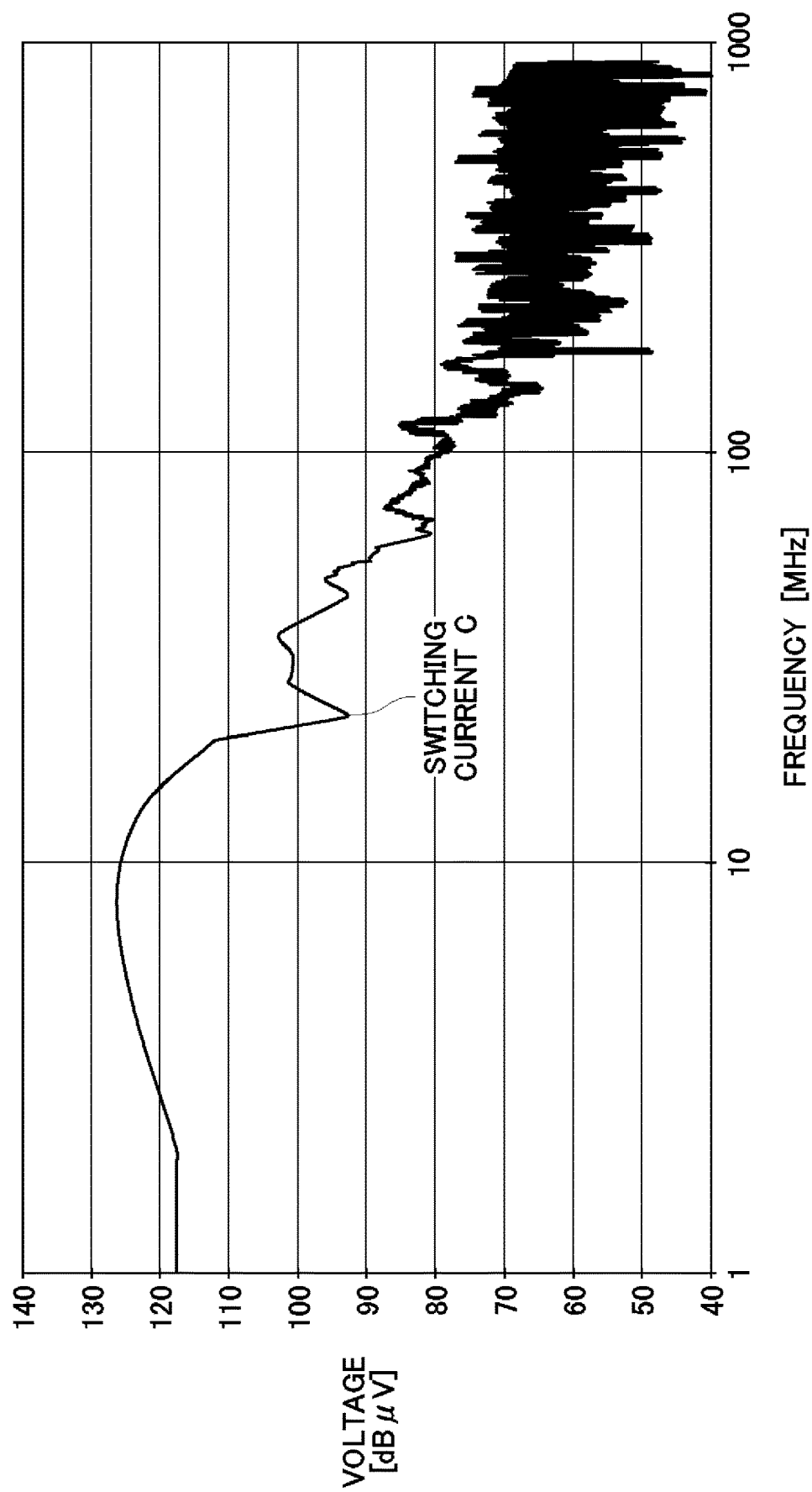
FIG. 11B shows an example of turn-on characteristics of the semiconductor device 10 output as an evaluation benchmark by the evaluation benchmark output unit 230 according to the present embodiment.

FIG. 11A and FIG. 11B show examples of turn-on characteristics of the semiconductor device 10 output as evaluation benchmarks by the evaluation benchmark output unit 230 according to the present embodiment. The evaluation benchmark is the turn-on characteristics obtained by varying the switching current flowing in the semiconductor device 10 according to a plurality of switching signals $V_S$. FIG. 11A and FIG. 11B show comparative turn-on characteristics for a switching current of 0 A, and three cases of turn-on characteristics corresponding to three predetermined values of switching current of $I_1$, $2I_1$, and $3I_1$.

Comparing these four waveforms, it can be seen that voltages are non-linear functions of switching current values. For example, the maximum values at different frequencies may correspond to different current conditions. As an example, the maximum value at 10 MHz corresponds to the switching current condition of $3I_1$, while the maximum value at 20 MHz corresponds to the switching current condition of $I_1$. Therefore, when the switching current of the semiconductor device 10 is changed, the radiated noise generated due to the switching current can be estimated by combining a plurality of evaluation benchmarks based on the change in the drive current. Such a combined evaluation apparatus 300 is described as follows.

Figure 12:
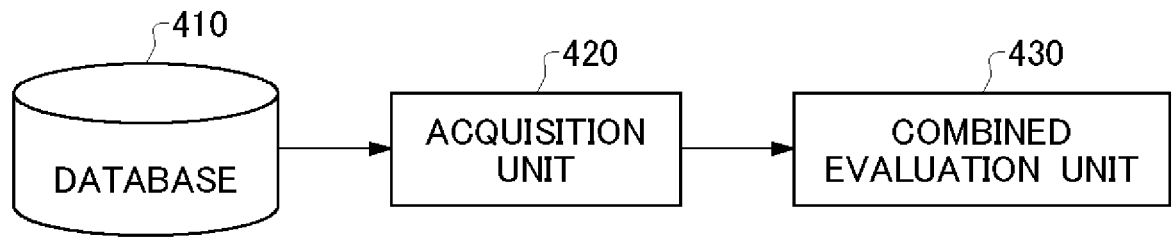
FIG. 12 shows an example configuration of a combined evaluation apparatus 300 in the present embodiment together with a database 410.

FIG. 12 shows an example configuration of a combined evaluation apparatus 300 according to the present embodiment together with a database 410. The database 410 stores evaluation benchmarks output by the evaluation apparatus 200. It is desirable that the database 410 stores evaluation benchmarks output for a plurality of different switching operations of the semiconductor device 10, each of which is performed under a plurality of different conditions of the switching signal. The database 410 may be the storage unit 240 of the evaluation apparatus 200.

The combined evaluation apparatus 300 uses these evaluation benchmarks to perform combined evaluation on the radiated noise emitted by an apparatus provided with the semiconductor device 10. The apparatus equipped with the semiconductor device 10 as shown in FIG. 6 is referred to as an equipped apparatus. The combined evaluation apparatus 300 includes an acquisition unit 420 and a combined evaluation unit 430.

The acquisition unit 420 acquires a plurality of evaluation benchmarks for the semiconductor device 10 that are output by the evaluation apparatus 200 in correspondence with switching signals of a plurality of different conditions. For example, the acquisition unit 420 acquires the evaluation benchmarks from the database 410 via a network or the like. The acquisition unit 420 may also be directly connected to the database 410 to acquire the evaluation benchmarks. The acquisition unit 420 may also acquire information of a drive signal for driving the semiconductor device 10.

The combined evaluation unit 430 combines the plurality of evaluation benchmarks according to the drive signal for driving the semiconductor device 10, to perform combined evaluation on the radiated noise of the equipped apparatus. For example, the combined evaluation unit 430 calculates an evaluation result of the radiated noise by summing the voltages of the plurality of evaluation benchmarks corresponding to each of predetermined frequencies. The combined evaluation unit 430 may also calculate an evaluation result for the radiated noise by calculating the average value or maximum value of the voltages of the plurality of evaluation benchmarks corresponding to each of predetermined frequencies. The combined evaluation unit 430 outputs the calculated evaluation result.

Figure 13:
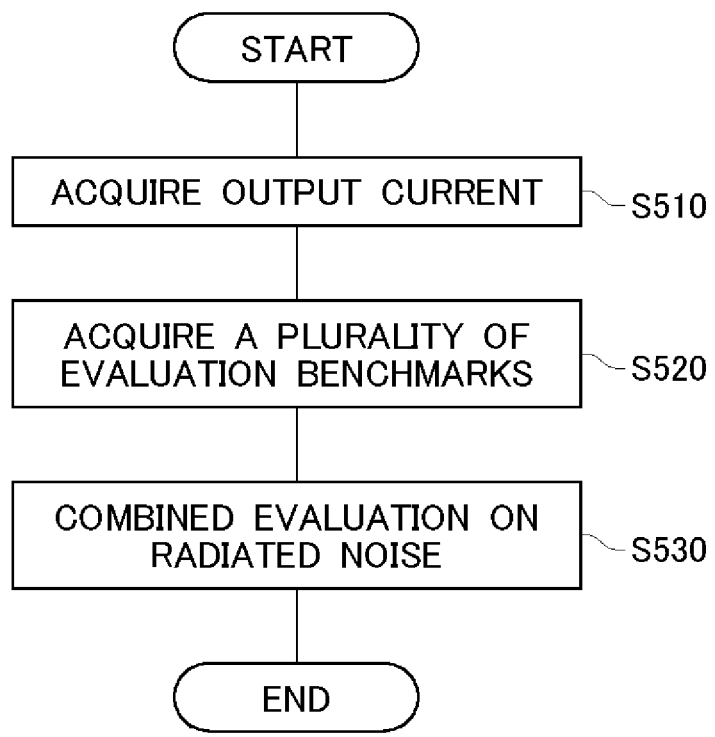
FIG. 13 shows an operation flow of the combined evaluation apparatus 300 according to the present embodiment.

FIG. 13 shows an operation flow of the combined evaluation apparatus 300 according to the present embodiment. The combined evaluation apparatus 300 performs the operations of S510 to S530 shown in FIG. 13 to perform combined evaluation on the radiated noise emitted by the semiconductor device 10 in the equipped apparatus.

First, a drive signal for driving the semiconductor device 10 is acquired (S510). The acquisition unit 420 acquires, from the database 410 or the like, information of the drive signal with which the equipped apparatus drives the semiconductor device 10. Alternatively, the acquisition unit 420 may be connected to the equipped apparatus to acquire information of the drive signal from the equipped apparatus. Alternatively, the acquisition unit 420 may receive information of the drive signal input by a user of the combined evaluation apparatus 300 such as a designer or user of the equipped apparatus.

Next, a plurality of evaluation benchmarks for the semiconductor device 10 that are output by the evaluation apparatus 200 in correspondence with switching operations under a plurality of different conditions are acquired (S520). The acquisition unit 420 acquires a combination of a plurality of evaluation benchmarks in correspondence with the drive signal of the semiconductor device 10. For example, the acquisition unit 420 acquires corresponding evaluation benchmarks according to the polarity, magnitude or the like of the drive signal. The acquisition unit 420 may also acquire corresponding evaluation benchmarks according to the temporal changes in the drive signal. The acquisition unit 420 may also calculate a plurality of evaluation benchmarks by multiplying the evaluation benchmarks by weights corresponding to the temporal changes in the drive signal.

Next, the combined evaluation unit 430 combines the plurality of evaluation benchmarks acquired by the acquisition unit 420 according to the drive signal for driving the semiconductor device 10, to perform combined evaluation on the radiated noise of the equipped apparatus (S530). For example, the combination of evaluation benchmarks used by the combined evaluation unit 430 is the maximum value or sum of the plurality of evaluation benchmarks for the semiconductor device 10. The combination of evaluation benchmarks used by the combined evaluation unit 430 may also be the average value of the plurality of evaluation benchmarks for the semiconductor device 10. The combination of evaluation benchmarks used by the combined evaluation unit 430 may also be the maximum value or sum and the average value of the plurality of evaluation benchmarks.

For example, the standards for radiated noise of electronic equipment such as defined by International Special Committee on Radio Interference (CISPR) are on the basis of quasi-peak values, average values and the like. Therefore, for compatibility with these standard values, the combined evaluation unit 430 may use the maximum value and average value of the plurality of evaluation benchmarks for combined evaluation of the radiated noise and output the evaluation result. In this case, for example, the quasi-peak value can be predicted to some extent based on the magnitude of the difference between the output maximum and average values, or the like.

The combination of evaluation benchmarks used by the combined evaluation unit 430 may also be the average value calculated after multiplying the plurality of evaluation benchmarks for the semiconductor device 10 by respective weights corresponding to the current output by the semiconductor device 10.

As described above, the combined evaluation apparatus 300 calculates an estimated value of the radiated noise by combining evaluation benchmarks that are accurately evaluated in advance according to the drive signal for driving the semiconductor device 10, and thus can perform combined evaluation on the radiated noise. The combined evaluation apparatus 300 according to the present embodiment acquires and combines evaluation benchmarks corresponding to the output current and switching current at the time of incorporation of the semiconductor device 10 into an apparatus from among a plurality of evaluation benchmarks obtained by observing and evaluating voltage variation in the semiconductor device 10 due to switching operations under various conditions. Thus, the combined evaluation apparatus 300 can use evaluation benchmarks obtained by evaluating respective values of radiated noise corresponding to the voltage variation in the semiconductor device 10, and therefore can estimate the radiated noise more accurately.

Figure 14A:
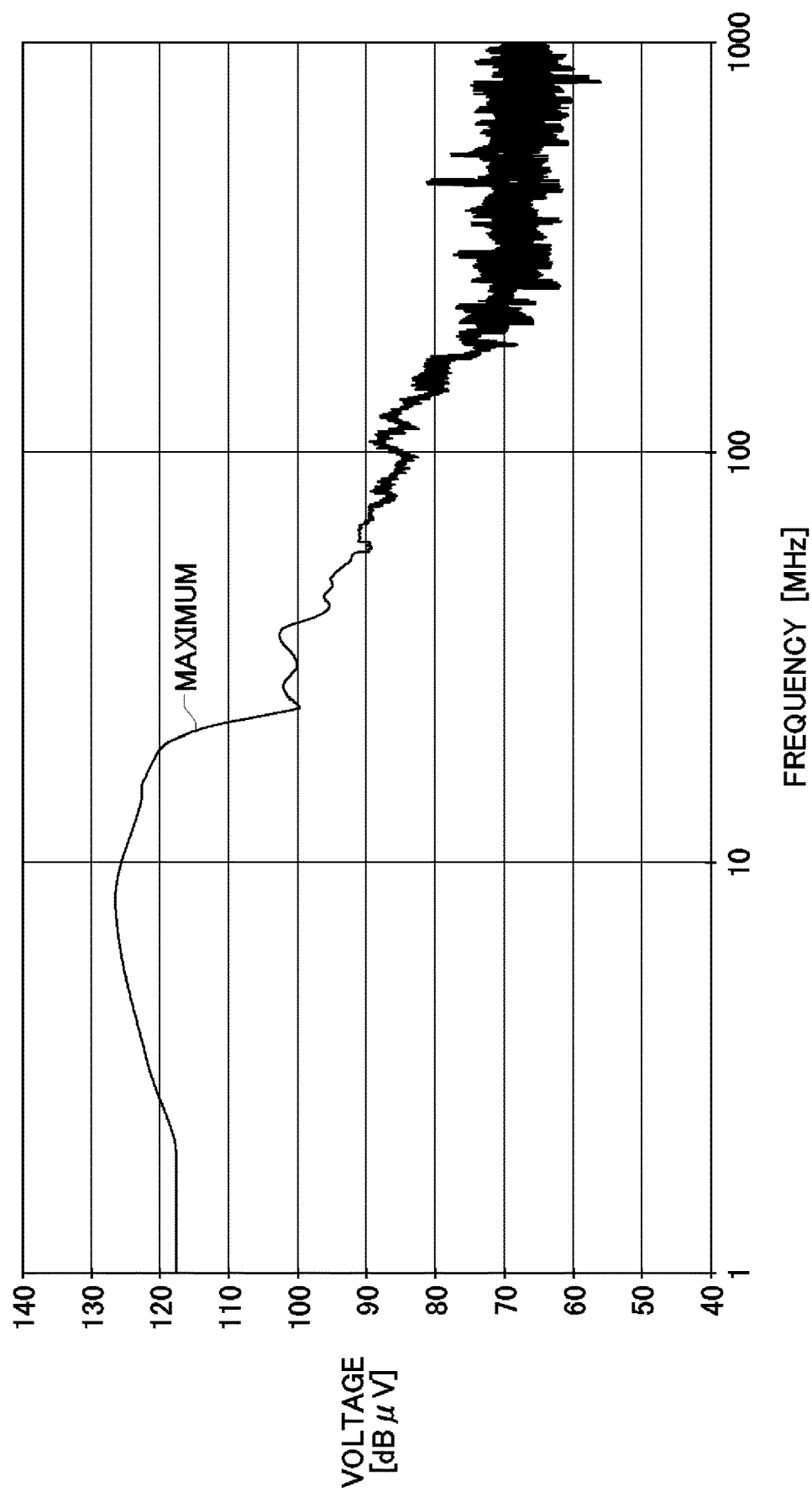
FIG. 14A shows an example of the result of combined evaluation on radiated noise performed by the combined evaluation apparatus 300 according to the present embodiment by combining the plurality of evaluation benchmarks shown in FIG. 11A and FIG. 11B.
Figure 14B:
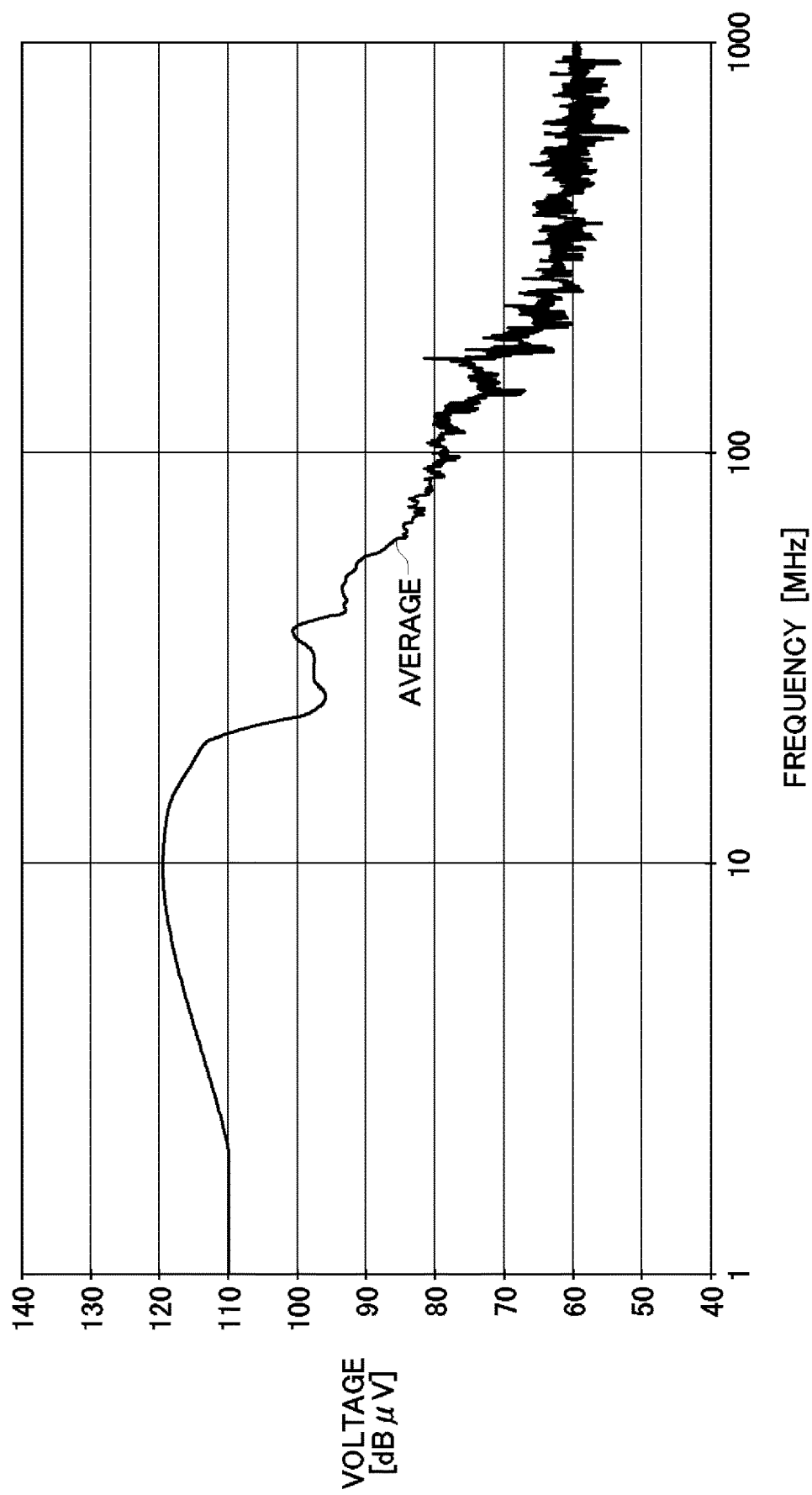
FIG. 14B shows an example of the result of combined evaluation on radiated noise performed by the combined evaluation apparatus 300 according to the present embodiment by combining the plurality of evaluation benchmarks shown in FIG. 11A and FIG. 11B.

FIG. 14A and FIG. 14B show examples of the result of combined evaluation on radiated noise performed by the combined evaluation apparatus 300 according to the present embodiment by combining the plurality of evaluation benchmarks shown in FIG. 11A and FIG. 11B. FIG. 14A and FIG. 14B are an example of the result output by the combined evaluation unit 430 by adopting the maximum value and average value of the plurality of evaluation benchmarks as the combination. That is, the waveform shown as "maximum value" in FIG. 14A indicates the maximum value of the four curves of turn-on characteristics shown in FIG. 11A and FIG. 11B for each frequency. Also, the waveform shown as "average value" in FIG. 14B indicates the average value of the four curves of turn-on characteristics shown in FIG. 11A and FIG. 11B for each frequency.

The tendency of the quasi-peak value can be further predicted based on these estimation results of the radiated noise. For example, it can be seen that, in a frequency region from 30 MHz to 60 MHz, the difference in voltage for each frequency between the two waveforms shown by the average value and maximum value is 6 dB or less. Thus, since the peak value and average value of the radiated noise have approximately the same level of intensity in this frequency region, it can be contemplated that the quasi-peak value in the frequency region has as high a level of intensity as the peak value.

Also, it can be seen that, in a frequency region from 100 MHz to 140 MHz, the difference in voltage for each frequency between the two waveforms shown by the average value and maximum value is about 6 dB to 10 dB. Thus, since the peak value and average value of the radiated noise have a large difference in this frequency region, it can be contemplated that the quasi-peak value in the frequency region has as low a level of intensity as the average value.

As described above, the combined evaluation apparatus 300 can combine a plurality of evaluation benchmarks to perform combined evaluation on the radiated noise, and thus can estimate the level of the radiated noise of equipment subject to the regulation based on the result of the combined evaluation. Also, the combined evaluation apparatus 300 can perform combined evaluation on the radiated noise even in the case of a more complex drive signal.

Figure 15:
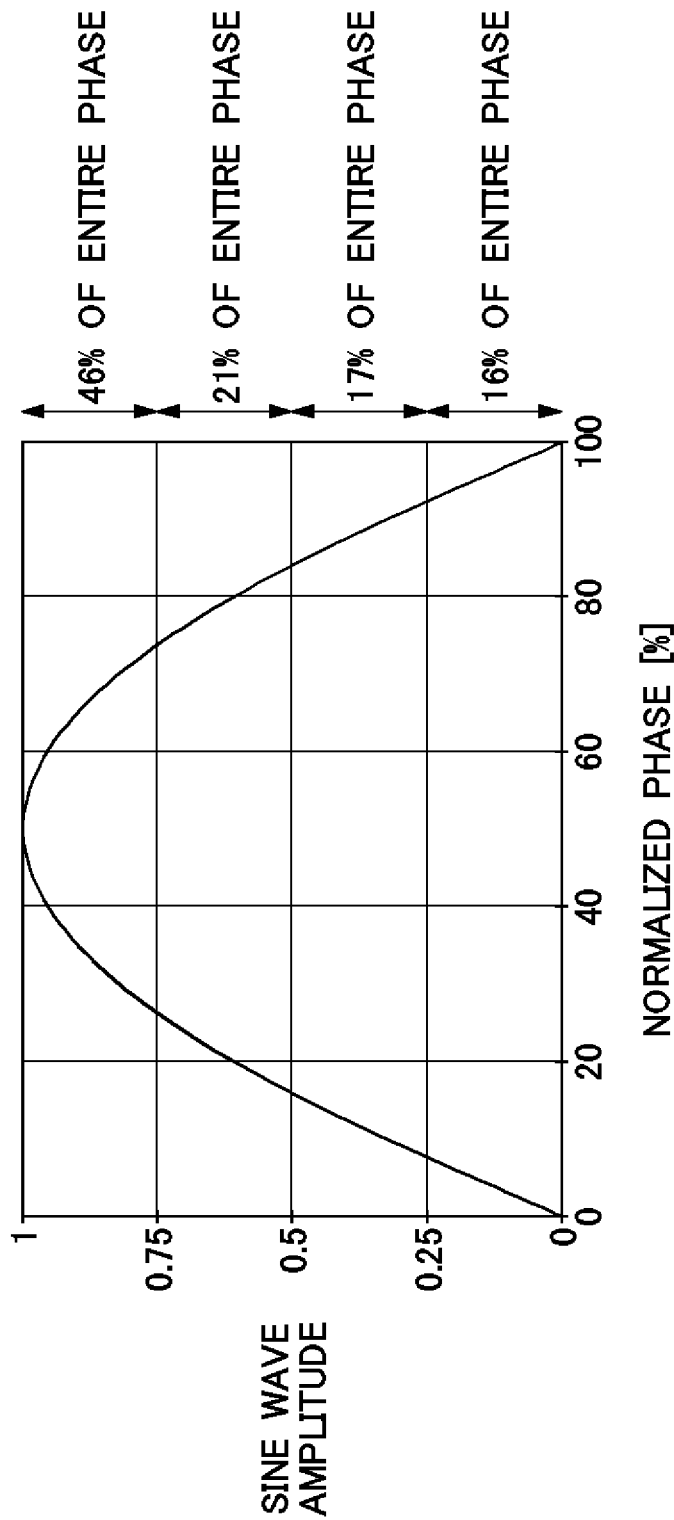
FIG. 15 shows an example of current waveform output by the to-be-evaluated semiconductor device 10 according to the present embodiment.

FIG. 15 shows an example in which a three-phase inverter is used as the apparatus, for example, and the output current waveform for a half period of a single phase is normalized. In FIG. 15, the horizontal axis is a normalized time axis and the vertical axis indicates normalized amplitude values of the drive signal. Since the output current is part of a sine wave signal, the horizontal axis, which is the time axis in FIG. 15, indicates phases normalized by setting the time corresponding to a phase of 180 degrees as 100%.

When the polarity of the output current is positive as shown in FIG. 15, the acquisition unit 420 acquires an evaluation benchmark output in correspondence with the turn-on operation of the semiconductor device 10, as an example. The acquisition unit 420 may also acquire an evaluation benchmark output by the evaluation apparatus 200 for a condition corresponding to the peak value of the amplitude of the sine wave. The acquisition unit 420 may also acquire an evaluation benchmark output by the evaluation apparatus 200 for a condition closest to the peak value of the amplitude of the sine wave. For example, the acquisition unit 420 multiplies the acquired evaluation benchmark by weights corresponding to the output current to acquire a plurality of evaluation benchmarks.

As an example, the acquisition unit 420 divides the output current into a plurality of regions according to the amplitude value. FIG. 15 shows an example in which the amplitude of the output current is equally divided into four regions of 0 to 0.25, 0.25 to 0.5, 0.5 to 0.75, and 0.75 to 1, with the peak value being 1. The acquisition unit 420 calculates the occupancy of the drive signal on the time axis in each region. For example, in the region of 0 to 0.25 amplitude, the output current occupies the regions of the first rising and last falling on the time axis. That is, in the region of 0 to 0.25 amplitude, the output current occupies 16% of the 100%, entire phase region, and thus the occupancy is set as 16%.

Similarly, for the acquisition unit 420, the occupancy of the region of 0.25 to 0.5 amplitude is set as 17%, the occupancy of the region of 0.5 to 0.75 amplitude is set as 21%, and the occupancy of the region of 0.75 to 1 amplitude is set as 46%. Such distribution of occupancy can be directly replaced with the generation frequency of switching currents in the three-phase inverter operation, and thereby the acquisition unit 420 can calculate a plurality of evaluation benchmarks according to the occupancy.

That is, the acquisition unit 420 calculates a first evaluation benchmark for the region of 0 to 0.25 amplitude by multiplying the voltage of a reference evaluation benchmark, which is obtained for the peak amplitude value of the output current, by 0.16 for each frequency. The acquisition unit 420 also calculates a second evaluation benchmark for the region of 0.25 to 0.5 amplitude by multiplying the reference evaluation benchmark by 0.17. Similarly, the acquisition unit 420 calculates a third evaluation benchmark for the region of 0.5 to 0.75 amplitude and a fourth evaluation benchmark for the region of 0.75 to 1 amplitude by multiplying the reference evaluation benchmark by 0.21 and 0.46, respectively. The combined evaluation unit 430 calculates the per-frequency average value of the four, first to fourth evaluation benchmarks as a combined evaluation value for the radiated noise. The combined evaluation unit 430 outputs the calculated combined evaluation value.

As described above, the combined evaluation apparatus 300 according to the present embodiment uses a plurality of evaluation benchmarks in consideration of the generation frequency of switching currents according to the output current, and thus can perform combined evaluation on the radiated noise more accurately for various output currents. Note that, while an example has been described in which the amplitude of the output current is equally divided into four regions in the present embodiment, this is not so limited. The number of division of the amplitude of the drive signal may be set to various number of division. The weights by which the evaluation benchmarks are multiplied and the like may also be adjustable according to the drive signal.

As described above, the evaluation apparatus 200 and the combined evaluation apparatus 300 according to the present embodiment can evaluate the radiated noise that would be caused if an apparatus or the like is equipped with the semiconductor device 10 before the equipment of the apparatus. Also, even if the drive signal for driving the semiconductor device 10 is complex, the combined evaluation apparatus 300 can perform combined evaluation on the radiated noise by combining the evaluation benchmarks output by the evaluation apparatus 200.

Also, outputting the evaluation benchmarks output by the evaluation apparatus 200 as a data sheet for the semiconductor device 10 allows providing useful information for facilitating the device design. Note that, in this case, it is desirable that the evaluation apparatus 200 outputs the evaluation benchmarks together with an evaluation result for a previous device. This makes it able to, for example, easily find a benchmark for how much the radiated noise decreases or increases compared to the case of the device previously used, so as to smoothly conduct the device design.

An example of the device design includes determining the driving condition or driving circuit constants for the semiconductor device in advance to meet the international standards. Specifically, the driving condition includes the relationship between the gate voltage value input to the gate terminal of the semiconductor device and time, and the like. Also, the driving circuit constants include a gate resistance value, a gate runner inductance value, a capacitance, the specification of a power supply used, and the like. Furthermore, if the radiated noise generated at the time of turn-on of a semiconductor device in the lower arm of a half-bridge circuit is dominant, for example, the driving condition, driving circuit constants or the like of the semiconductor device in the lower arm is adjusted. The configuration of the apparatus includes providing a shield plate between the semiconductor device with dominant radiated noise and a printed circuit board, determining arrangements in the apparatus according to the intensity of radiated noise, providing a shield plate to the apparatus housing, connecting to the ground, and the like.

For the design of the semiconductor device, internal resistance values or the like of the device may be adjusted. Also, the design of a module equipped with the semiconductor device may include adjustments for insulating substrates, resin insulating substrates and the like such as the adjustment of the number of such substrates, circuit patterns formed thereon, thicknesses, current paths, and thicknesses and materials of insulating plates used for the insulating substrates and the like, and the adjustment or the like of the shape, dimension, and material of wirings (wires, lead flames and the like) bonded to surface electrodes formed on the semiconductor device, the adjustment or the like of the shape and material of the housing (case) used for the module.

Note that, while the evaluation apparatus 200 and the combined evaluation apparatus 300 are described as separate, independent apparatuses in the present embodiment, they are not limited to such configuration. For example, the evaluation apparatus 200 and the combined evaluation apparatus 300 may be constituted as a single apparatus. Also, the evaluation apparatus 200 and/or the combined evaluation apparatus 300 may be at least partially constituted with a computer or the like.

Various embodiments of the present invention may be described with reference to flowcharts and block diagrams whose blocks may represent (1) steps of processes in which operations are performed or (2) units of apparatuses responsible for performing operations. Certain steps and units may be implemented by dedicated circuitry, programmable circuitry supplied with computer-readable instructions stored on computer-readable media, and/or processors supplied with computer-readable instructions stored on computer-readable media.

Dedicated circuitry may include digital and/or analog hardware circuits and may include integrated circuits (IC) and/or discrete circuits. Programmable circuitry may include reconfigurable hardware circuits comprising logical AND, OR, XOR, NAND, NOR, and other logical operations, flip-flops, registers, memory elements, etc., such as field-programmable gate arrays (FPGA), programmable logic arrays (PLA), etc.

Computer-readable media may include any tangible device that can store instructions for execution by a suitable device, such that the computer-readable medium having instructions stored therein comprises an article of manufacture including instructions which can be executed to create means for performing operations specified in the flowcharts or block diagrams. Examples of computer-readable media may include an electronic storage medium, a magnetic storage medium, an optical storage medium, an electromagnetic storage medium, a semiconductor storage medium, etc.

More specific examples of computer-readable media may include a floppy disk, a diskette, a hard disk, a random access memory (RAM), a read-only memory (ROM), an erasable programmable read-only memory (EPROM or Flash memory), an electrically erasable programmable read-only memory (EEPROM), a static random access memory (SRAM), a compact disc read-only memory (CD-ROM), a digital versatile disk (DVD), a BLU-RAY® disc, a memory stick, an integrated circuit card, etc.

Computer-readable instructions may include assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, JAVA®, C++, etc., and conventional procedural programming languages, such as the "C" programming language or similar programming languages.

Computer-readable instructions may be provided to a processor of a general purpose computer, special purpose computer, or other programmable data processing apparatus, or to programmable circuitry, locally or via a local area network (LAN), wide area network (WAN) such as the Internet, etc., to execute the computer-readable instructions to create means for performing operations specified in the flowcharts or block diagrams. Examples of processors include computer processors, processing units, microprocessors, digital signal processors, controllers, microcontrollers, etc.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. An evaluation method comprising:
    causing a semiconductor device to perform switching operations including a reverse recovery switching operation and a turn-on switching operation;
    measuring a voltage variation occurring in the semiconductor device during each of the switching operations;
    performing frequency domain measurements on the measured voltage variation during each of the switching operations; and
    outputting the frequency domain measurements as an evaluation benchmark for radiated noise of the semiconductor device based on the voltage variation.

2. The evaluation method according to claim 1, wherein the outputting the evaluation benchmark comprises calculating the voltage variation in the semiconductor device for each frequency component as the evaluation benchmark.

3. The evaluation method according to claim 1, wherein the switching operations further comprise a turn-off operation, and a forward recovery operation of the semiconductor device.

4. The evaluation method according to claim 1, wherein:
    the semiconductor device comprises a first device and a second device connected in series; and
    the measuring comprises measuring variation in a voltage between the first device and the second device.

5. The evaluation method according to claim 1, wherein:
    the semiconductor device comprises a first device and a second device connected in series; and
    the measuring comprises measuring variation in a voltage across the first device and the second device.

6. The evaluation method according to claim 4, wherein the measuring comprises measuring variation in a voltage of the semiconductor device relative to a reference potential, the reference potential being a potential of a conductive member to which the semiconductor device is attached via an insulating material.

7. The evaluation method according to claim 1, further comprising:
    comparing the evaluation benchmark output for the semiconductor device and an evaluation benchmark output for a reference device different from the semiconductor device; and
    evaluating an intensity of the radiated noise of the semiconductor device relative to the reference device based on a result of the comparison.

8. An estimation method for estimating radiated noise of an apparatus provided with the semiconductor device, the estimation method comprising:
    acquiring a plurality of evaluation benchmarks for the semiconductor device that are output in correspondence with the switching operations under a plurality of conditions by using the evaluation method according to claim 1; and
    combining the plurality of evaluation benchmarks to estimate the radiated noise of the apparatus.

9. The estimation method according to claim 8, wherein the combination of the evaluation benchmarks is a maximum value or a sum of the plurality of evaluation benchmarks for the semiconductor device.

10. The estimation method according to claim 8, wherein the combination of the evaluation benchmarks is an average value of the plurality of evaluation benchmarks for the semiconductor device.

11. The estimation method according to claim 8, wherein the combination of the evaluation benchmarks is an average value calculated after multiplying the plurality of evaluation benchmarks for the semiconductor device by respective weights corresponding to the plurality of conditions.

12. An evaluation apparatus comprising:
    a signal supplying unit configured to supply a predetermined switching signal to a to-be-evaluated semiconductor device to cause switching operations including a reverse recovery switching operation and a turn-on switching operation;
    a detection unit configured to detect a voltage variation in the semiconductor device during each of the switching operations;

a radiated noise measurement instrument for performing frequency domain measurement during each of the switching operations; and an evaluation benchmark output unit configured to output the frequency domain measurements as an evaluation benchmark for radiated noise of the semiconductor device based on the voltage variation detected by the detection unit.

13. The evaluation apparatus according to claim 12, wherein the evaluation benchmark output unit is configured to calculate an electric field strength corresponding to the radiated noise of the semiconductor device based on a frequency component of the voltage variation.

14. The evaluation apparatus according to claim 12, wherein the signal supplying unit is configured to supply a switching signal to further perform a turn-off operation, and a forward recovery operation of the semiconductor device.

15. The evaluation apparatus according to claim 12, wherein:
the semiconductor device comprises a first device and a second device connected in series; and
the detection unit is configured to measure variation in a voltage between the first device and the second device.

16. The evaluation apparatus according to claim 12, wherein:
the semiconductor device comprises a first device and a second device connected in series; and
the detection unit is configured to measure variation in a voltage between main terminals of the first device and the second device.

17. The evaluation apparatus according to claim 12, further comprising:
a storage unit configured to store the evaluation benchmark output by the evaluation benchmark output unit; and
a comparison unit configured to compare the evaluation benchmark output by the evaluation benchmark output unit and an evaluation benchmark for a reference device different from the semiconductor device stored in the storage unit; and
an evaluation unit configured to evaluate a relative change in intensity of the evaluation benchmark for the radiated noise of the semiconductor device based on a result of the comparison.

18. The evaluation apparatus according to claim 12, wherein the detection unit is configured to measure variation in a voltage of the semiconductor device relative to a reference potential, the reference potential being a potential of a conductive member to which the semiconductor device is attached via an insulating material.

19. A combined evaluation apparatus, comprising:
an acquisition unit configured to acquire a plurality of evaluation benchmarks for the semiconductor device that are output by the evaluation apparatus according to claim 12 in correspondence with the switching signal under a plurality of conditions;
a combined evaluation unit configured to combine the plurality of evaluation benchmarks to estimate radiated noise of an apparatus provided with the semiconductor device.

* * * * *